United States Patent
Anthony et al.

(10) Patent No.: US 6,687,108 B1
(45) Date of Patent: *Feb. 3, 2004

(54) PASSIVE ELECTROSTATIC SHIELDING STRUCTURE FOR ELECTRICAL CIRCUITRY AND ENERGY CONDITIONING WITH OUTER PARTIAL SHIELDED ENERGY PATHWAYS

(75) Inventors: William M. Anthony, Erie, PA (US); Anthony A. Anthony, Erie, PA (US)

(73) Assignee: X2Y Attenuators, LLC, Santa Monica, CA (US)

( * ) Notice: Subject to any disclaimer, the term of this patent is extended or adjusted under 35 U.S.C. 154(b) by 168 days.

This patent is subject to a terminal disclaimer.

(21) Appl. No.: 09/777,021

(22) Filed: Feb. 5, 2001

Related U.S. Application Data

(63) Continuation-in-part of application No. 09/600,530, filed as application No. PCT/US99/01040 on Jan. 16, 1999, application No. 09/777,021, which is a continuation-in-part of application No. 09/632,048, filed on Aug. 3, 2000, which is a continuation-in-part of application No. 09/594,447, filed on Jun. 15, 2000, which is a continuation-in-part of application No. 09/579,606, filed on May 26, 2000, which is a continuation-in-part of application No. 09/460,218, filed on Dec. 13, 1999, which is a continuation of application No. 09/056,379, filed on Apr. 7, 1998, now Pat. No. 6,018,448, which is a continuation-in-part of application No. 09/008,769, filed on Jan. 19, 1998, now Pat. No. 6,097,581, which is a continuation-in-part of application No. 08/841,940, filed on Apr. 8, 1997, now Pat. No. 5,909,350.

(60) Provisional application No. 60/255,818, filed on Dec. 15, 2000, provisional application No. 60/253,793, filed on Nov. 29, 2000, provisional application No. 60/252,766, filed on Nov. 22, 2000, provisional application No. 60/248,914, filed on Nov. 15, 2000, provisional application No. 60/241,128, filed on Oct. 17, 2000, provisional application No. 60/225,497, filed on Aug. 15, 2000, provisional application No. 60/215,314, filed on Jun. 30, 2000, provisional application No. 60/203,863, filed on May 12, 2000, provisional application No. 60/200,327, filed on Apr. 28, 2000, provisional application No. 60/191,196, filed on Mar. 22, 2000, provisional application No. 60/185,320, filed on Feb. 28, 2000, and provisional application No. 60/180,101, filed on Feb. 3, 2000.

(51) Int. Cl.[7] ................................................. H02H 9/00
(52) U.S. Cl. ........................ 361/118; 361/58; 361/91.1; 361/111
(58) Field of Search .......................... 361/118, 58, 91.1, 361/127, 113, 111, 117, 119

(56) References Cited

U.S. PATENT DOCUMENTS

| | | |
|---|---|---|
| 3,842,374 A | 10/1974 | Schlicke |
| 4,262,317 A | 4/1981 | Baumbach |
| 4,335,417 A | 6/1982 | Sakshaug et al. |

(List continued on next page.)

FOREIGN PATENT DOCUMENTS

| | | |
|---|---|---|
| DE | 198 57 043 C1 | 3/2000 |
| JP | 3-18112 | 1/1991 |
| JP | 6-53048 | 2/1994 |

(List continued on next page.)

OTHER PUBLICATIONS

PCT International Search Report for International Application No. PCT/US/98/06962 Aug. 19, 1998.

(List continued on next page.)

*Primary Examiner*—Stephen W. Jackson
(74) *Attorney, Agent, or Firm*—Hahn, Loeser & Parks, LLP

(57) ABSTRACT

The present invention relates to a universal multi-functional common conductive shield structure plus two electrically opposing differential energy pathways which in part uses a electrode shielding architecture with stacked conductive hierarchy progression comprising circuitry for energies propagating simultaneous along paired and electrically differential pathways that utilize bypass or feed-thru energy propagation modes. The invention, when energized, will allow both the outer partially shielded paired differential conductive energy pathway electrodes, as well as the contained and oppositely paired differential conductive energy pathway electrodes to function with respect to one another, in complementary, yet in an electrically opposite manner, respectively.

23 Claims, 6 Drawing Sheets

U.S. PATENT DOCUMENTS

| | | |
|---|---|---|
| 4,587,589 A | 5/1986 | Marek |
| 4,682,129 A | 7/1987 | Bakermans et al. |
| 4,772,225 A | 9/1988 | Ulery |
| 5,079,069 A | 1/1992 | Howard et al. |
| 5,140,497 A | 8/1992 | Kato et al. |
| 5,142,430 A | 8/1992 | Anthony |
| 5,155,655 A | 10/1992 | Howard et al. |
| 5,161,086 A | 11/1992 | Howard et al. |
| 5,181,859 A | 1/1993 | Foreman et al. |
| 5,236,376 A | 8/1993 | Cohen |
| 5,243,308 A | 9/1993 | Shusterman et al. |
| 5,251,092 A | 10/1993 | Brady et al. |
| 5,261,153 A | 11/1993 | Lucas |
| 5,268,810 A | 12/1993 | DiMarco et al. |
| 5,290,191 A | 3/1994 | Foreman et al. |
| 5,321,373 A | 6/1994 | Shusterman et al. |
| 5,321,573 A | 6/1994 | Person et al. |
| 5,337,028 A | 8/1994 | White |
| 5,353,189 A | 10/1994 | Tomlinson |
| 5,396,201 A | 3/1995 | Ishizaki et al. |
| 5,414,587 A | 5/1995 | Kiser et al. |
| 5,455,734 A | 10/1995 | Foreman et al. |
| 5,483,407 A | 1/1996 | Anastasio et al. |
| 5,500,629 A | 3/1996 | Meyer |
| 5,512,196 A | 4/1996 | Mantese et al. |
| 5,555,150 A | 9/1996 | Newman, Jr. |
| 5,568,348 A | 10/1996 | Foreman et al. |
| 5,592,391 A | 1/1997 | Muyshondt et al. |
| 5,751,539 A | 5/1998 | Stevenson et al. |
| 5,828,093 A | 10/1998 | Naito et al. |
| 5,838,216 A | 11/1998 | White et al. |
| 5,880,925 A | 3/1999 | DuPre et al. |
| 5,889,445 A | 3/1999 | Ritter et al. |
| 5,900,350 A * | 5/1999 | Provost et al. ............... 361/118 |
| 5,909,350 A | 6/1999 | Anthony |
| 6,018,448 A | 1/2000 | Anthony |
| 6,034,864 A | 3/2000 | Naito et al. |
| 6,038,121 A | 3/2000 | Naito et al. |
| 6,072,687 A | 6/2000 | Naito et al. |
| 6,097,581 A | 8/2000 | Anthony |

FOREIGN PATENT DOCUMENTS

| | | |
|---|---|---|
| JP | 6-53049 | 2/1994 |
| JP | 6-53075 | 2/1994 |
| JP | 6-53077 | 2/1994 |
| JP | 6-53078 | 2/1994 |
| JP | 6-84695 | 3/1994 |
| JP | 6-151014 | 5/1994 |
| JP | 6-151244 | 5/1994 |
| JP | 6-151245 | 5/1994 |
| JP | 6-325977 | 11/1994 |
| JP | 7-235406 | 9/1995 |
| JP | 7-235852 | 9/1995 |
| JP | 7-240651 | 9/1995 |
| JP | 8-124795 | 5/1996 |
| JP | 8-172025 | 7/1996 |
| JP | 11-214256 | 8/1999 |
| WO | WO 00/16446 | 3/2000 |

OTHER PUBLICATIONS

PCT International Search Report for International Application No. PCT/US99/01040 Apr. 19, 1999.

PCT International Search Report for International Application No. PCT/US99/07653 Jul. 19, 1999.

PCT International Search Report for International Application No. PCT/US00/11409 Sep. 18, 2000.

PCT International Search Report for International Application No. PCT/US00/14626 Sep. 13, 2000.

PCT International Search Report for International Application No. PCT/US00/16518 Nov. 8, 2000.

* cited by examiner

PASSIVE ELECTROSTATIC SHIELDING STRUCTURE FOR ELECTRICAL CIRCUITRY AND ENERGY CONDITIONING WITH OUTER PARTIAL SHIELDED ENERGY PATHWAYS

This application is a continuation-in-part of co-pending application Ser. No. 09/600,530 filed Jul. 18, 2000, which is a U.S. national stage application of international application PCT/US99/01040 filed Jan. 16, 1999; this application is also a continuation-in-part of co-pending application Ser. No. 09/632,048 filed Aug. 3, 2000, which is a continuation-in-part of co-pending application Ser. No. 09/594,447 filed Jun. 15, 2000, which is a continuation-in-part of application Ser. No. 09/579,606 filed May 26, 2000, which is a continuation-in-part of co-pending application Ser. No. 09/460,218 filed Dec. 13, 1999, which is a continuation of application Ser. No. 09/056,379 filed Apr. 7, 1998, now issued as U.S. Pat. No. 6,018,448, which is a continuation-in-part of application Ser. No. 09/008,769 filed Jan. 19, 1998, now issued as U.S. Pat. No. 6,097,581, which is a continuation-in-part of application Ser. No. 08/841,940 filed Apr. 8, 1997, now issued as U.S. Pat. No. 5,909,350.

This application also incorporates portions of co-pending and co-owned U.S. Provisional Applications herein by reference including U.S. Provisional Application No. 60/180,101 filed Feb. 3, 2000, U.S. Provisional Application No. 60/185,320 filed Feb. 28, 2000, U.S. Provisional Application No. 60/191,196 filed Mar. 22, 2000, U.S. Provisional Application No. 60/200,327 filed Apr. 28, 2000, U.S. Provisional Application No. 60/203,863 filed May 12, 2000, U.S. Provisional Application No. 60/215,314 filed Jun. 30, 2000, U.S. Provisional Application No. 60/225,497 filed Aug. 15, 2000, U.S. Provisional Application No. 60/241,128 filed Oct. 17, 2000, U.S. Provisional Application No. 60/248,914 filed Nov. 15, 2000, U.S. Provisional Application No. 60/252,766 filed Nov. 22, 2000, U.S. Provisional Application No. 60/253,793 filed Nov. 29, 2000, U.S. Provisional Application No. 60/255,818 filed Dec. 15, 2000, as they all relate in one form or another to continued improvements to this new family of multi-functional energy conditioners and shield structures for energy propagating circuits.

TECHNICAL FIELD

This application relates to a universal multi-functional common conductive shield structure plus electrically opposing differential energy pathways which in part uses a faraday shield architecture with stacked conductive hierarchy progression comprising circuitry for energies propagating simultaneous along paired and electrically differential pathways that utilize bypass and feed-thru energy propagation modes. In addition, the uses of electrically and physically opposing differential electrodes that sandwich the total stacked conductive hierarchy progression in a predetermined manner offer additional structure embodiments. The present invention also relates to discreet and non-discrete versions of a universal multi-functional common conductive shield structure plus electrically opposing differential energy pathways which in part uses a faraday shield architecture with stacked conductive hierarchy progression comprising circuitry that can comprise energy propagation modes and possesses a balancing, centrally positioned and commonly shared common conductive energy pathway or electrode to complementary and simultaneously shield and smooth energy decoupling operations between energized conductive pathways and electrodes. The invention, when energized, will almost always allow both the outer partially shielded paired differential conductive energy pathway electrodes, as well as the contained and oppositely paired differential conductive energy pathway electrodes to function with respect to one another, in balance, yet in an electrically opposite complementary manner, respectively.

BACKGROUND OF THE INVENTION

The present invention relates to a layered, universal multi-functional common conductive shield structure plus electrically opposing complementary, energy pathways for circuitry and energy conditioning that also possesses a commonly shared and centrally positioned conductive pathway or electrode that can complementary and simultaneously shield and allow smooth energy interaction between energized conductive pathway electrodes. The invention, when energized, will usually allow the contained conductive pathways or electrodes to operate with respect to one another harmoniously, yet in an oppositely phased or charged manner, respectively. When placed into a circuit and energized, an invention embodiment will also provide EMI filtering and surge protection while maintaining an apparent even or balanced voltage supply between a source and an energy utilizing-load. In addition, the invention will almost always be able to effectively provide simultaneous energy conditioning functions that include bypassing, energy and signal decoupling, energy storage, and continued balance in Simultaneous Switching Operations (SSO) states of an integrated circuit gate. These conditioning functions are provided with minimum contribution of disruptive energy parasitics placed back into the circuit system as an invention embodiment is passively operated within the circuit.

Today, as the density of electronic devices in societies throughout the world is increasing, governmental and self-imposed standards for the suppression of Electromagnetic Interference (EMI) and immunization off electronics from that interference have become much stricter. Only a few years ago, the primary causes of interference were from sources and conditions such as voltage imbalances, spurious voltage transients from power surges, human beings, or other electromagnetic wave generators.

At higher operating frequencies, line conditioning of propagating energy with prior art componentry has led to increased levels of interference in the form of EMI, RFI, and capacitive and inductive parasitics. These increases are due in part to the inherent manufacturing imbalances and performance deficiencies of the passive componentry that create or induce interference into the associated electrical circuitry when functioning at higher operating frequencies. EMI can also be generated from the electrical circuit pathway itself, which makes shielding from EMI desirable. Differential and common mode noise energy can be generated and will almost always traverse along and around cables, circuit board tracks or traces, high-speed transmission lines and bus line pathways. In many cases, these critical energy conductors act as an antenna radiating energy fields that aggravate the problem even more.

Other sources of EMI interference are generated from the active silicon components as they operate or switch. These problems such as SSO are notorious causes of circuit disruptions. Problems that include unshielded differential energy pathways that allow parasitic energy to freely couple upon or onto the electrical circuitry are known in the industry to generate significant interference at high frequencies.

Other disruptions to a circuit derive from large voltage transients, as well as ground loop interference caused by varying ground potentials, which can render a delicately balanced computer or electrical system useless. Existing surge and EMI protection devices have been unable to provide adequate protection in a single integrated package. Varieties of discrete and networked lump filters, decouplers, surge suppression devices, combinations, and circuit configurations have proven ineffectual as evidenced by the deficiency of the prior art.

Various portions of Ser. No. 09/632,048 filed Aug. 3, 2000, which is a continuation-in-part of co-pending application Ser. No. 09/594,447 filed Jun. 15, 2000, which is a continuation-in-part of co-pending application Ser. No. 09/579,606 filed May 26, 2000, which is a continuation-in-part of co-pending application Ser. No. 09/460,218 filed Dec. 13, 1999, as well as portions of the following co-owned U.S. Patents: U.S. Pat. No. 6,097,581, U.S. Pat. No. 6,018,448, U.S. Pat. No. 5,909,350, and U.S. Pat. No. 5,142,430 have been by the applicants and relate to continued improvements to a new family of discrete, multi-functional energy conditioners. These multi-functional energy conditioners posses a commonly shared, centrally located, common conductive electrode of a structure that can complementary and simultaneously interact with energized and paired electrical complementary, differential conductive energy pathway electrodes attached to an external energy-carrying conductive pathways. These opposing differential energy-carrying conductive pathways can operate in an oppositely phased or charged complementary, manner with respect to each other and are separated from one another by a physical shielding.

This application expands upon this concept and further discloses a new embodiment of what the applicants believe to be part of a system of circuit protection and conditioning that will help solve or reduce industry problems and obstacles.

This application also provides the manufacturing infrastructure is also provided with an unprecedented ease of adaptability or production changeover as compared to the prior art.

SUMMARY OF THE INVENTION

Based upon the foregoing, there has been found a need to provide a layered, multifunctional, common conductive shield structure containing energy-conductive pathways that share a common and centrally positioned common conductive pathway or electrode as part of its structure which allows for energy conditioning as well as a multitude of other functions simultaneously, within one inclusive embodiment or embodiment.

The layered, multi-functional, common conductive shield structure also provides simultaneous physical and electrical shielding to portions of propagating energy existing on electrically opposing differential electrode energy pathways by allowing predetermined, simultaneous energy interactions to take place between grouped and energized conductive pathways and various conductive pathways external to the embodiment elements.

A superior approach for high frequency decoupling is to provide a tight and closely placed low impedance, parallel energy pathways internally and adjacent to the electrically opposing differential electrode energy pathways or power/signal planes as opposed to utilizing many low impedance decoupling capacitors in parallel on a PCB in an attempt to accomplish the same goal.

Accordingly, the solution to low impedance power distribution above several hundred MHz lies in internally, parallel complementary aligned and positioned, thin dielectric power plane technologies, in accordance with the present invention.

Therefore, it is also an object of an invention embodiment to be able to operate effectively across a broad frequency range as compared to a single component or a single passive conditioning network. Ideally, this invention can be universal in its application potentials and by utilizing various embodiments of predetermined grouped elements; a working invention will almost always continue to perform effectively within a system operating beyond 1 GHz of frequency.

It is an object of an invention embodiment to be able to provide energy decoupling for active system loads while simultaneously maintaining a constant, apparent voltage potential for that portion of active componentry and its circuitry.

It is an object of an invention embodiment to minimize, suppress or filter unwanted electromagnetic emissions resulting from differential and common mode currents flowing within electronic pathways that come under an invention embodiment influence.

It is an object of an invention embodiment to provide a multi-functional, common conductive shield and energy conditioning structure for conductive energy pathways which can take on a wide variety of multi-layered embodiments and utilize a host of dielectric materials, unlimited by their specific physical properties that can, when attached into circuitry and energized, provide simultaneous line conditioning functions and protections as will be described.

It is an object of an invention embodiment to provide the ability to the user to solve problems or limitations not met with prior art devices which include, but are not limited to, simultaneous source to load and/or load to source decoupling, differential mode and common mode EMI filtering, containment and exclusion of most of the energy parasitics, as well as, surge protection in one integrated embodiment and that performs these described utilizing a common conductive area or common energy pathway that is external to the originally manufactured embodiment.

It is an object of an invention embodiment to be easily adapted to utilization with one or more external conductive attachments to a common conductive area located external to the originally manufactured invention, which can aid the invention embodiments in providing protection to electronic system circuitry. Additionally, protection is offered from an in-service to active electronic components from electromagnetic field interference (EMI), over voltages, and debilitating electromagnetic emissions contributed from an invention embodiment itself, which in prior art devices would be contributed as parasitics back into the host circuitry.

It is an object of an invention embodiment to provide a physically integrated, shield-containment, conductive electrode architecture for the use with independent electrode materials and/or an independent dielectric material composition, that when manufactured, will not limit an invention embodiment to a specific form, shape, or size for the multitude of possible embodiments of the invention that can be created and is not limited to embodiments shown herein.

It is an object of an invention embodiment to provide a user with an embodiment that gives the user the ability to realize a comparatively inexpensive, miniaturized, solution that would be available for integration and incorporation into a plurality of electronic products.

It is an object of an invention embodiment to provide an embodiment that reduces the need for additional supporting discrete passive components to achieve the desired filtering and/or line conditioning that prior art components are unable to provide.

It is an object of an invention embodiment to provide an embodiment giving the user an ability to realize an easily manufactured, adaptable, multi-functional electronic embodiment for a homogenous solution to a wide portion of the electrical problems and constraints currently faced when using prior art devices.

It is another object of an invention embodiment to provide an embodiment in the form of discrete or non-discrete devices, or pre-determined groupings of conductive pathways, that form a multi-functioning electronic embodiment, that when attached to an external conductive pathway or a pre-determined conductive surface, operates effectively across a broad frequency range and simultaneously provides energy decoupling for active circuit componentry, while maintaining a constant apparent voltage potential for portions of circuitry.

It is another object of an invention embodiment to provide an embodiment in the form of discrete or non-discrete devices, or pre-determined groupings of conductive pathways, that form a multi-functioning electronic embodiment to provide a blocking circuit or circuits utilizing an inherent common conductive pathway inherent to the embodiment, which is combined with an external conductive surface or ground area to provide connection to an additional energy pathway from the paired conductive pathway conductors for attenuating EMI and over voltages.

It is another object of an invention embodiment to provide an embodiment that utilizes standard manufacturing processes and be constructed of commonly found dielectric and conductive or conductively made materials to reach tight capacitive tolerances between electrical pathways within the embodiment while simultaneously maintaining a constant and uninterrupted conductive pathway for energy propagating from a source to an energy utilizing load.

Lastly, it is an object of an invention embodiment to provide an embodiment that couples pairs of electrical conductors very closely in relation to one another into an area or space partially enveloped by a plurality of commonly joined conductive electrodes, plates, or pathways, and can provide a user with a choice of selectively coupling external conductors or pathways on to separate, non-common conductive energy pathways or electrode plates located as part of the same embodiment.

Numerous other arrangements and configurations are also disclosed which implement and build on the above objects and advantages of an invention embodiment in order to demonstrate the versatility and wide spread application of a universal multi-functional common conductive shield structure plus two electrically opposing differential energy pathways for energy and EMI conditioning and protection, within the scope of the present invention.

BRIEF DESCRIPTION OF THE INVENTION

FIG. 6–FIG. 6A shows a detailed plan view of a portion of a common conductive shielding electrode pathway portion depicting a typical spilt electrode configuration in accordance with the present invention.

DETAILED DESCRIPTION OF THE PREFERRED EMBODIMENT

Figure 1:
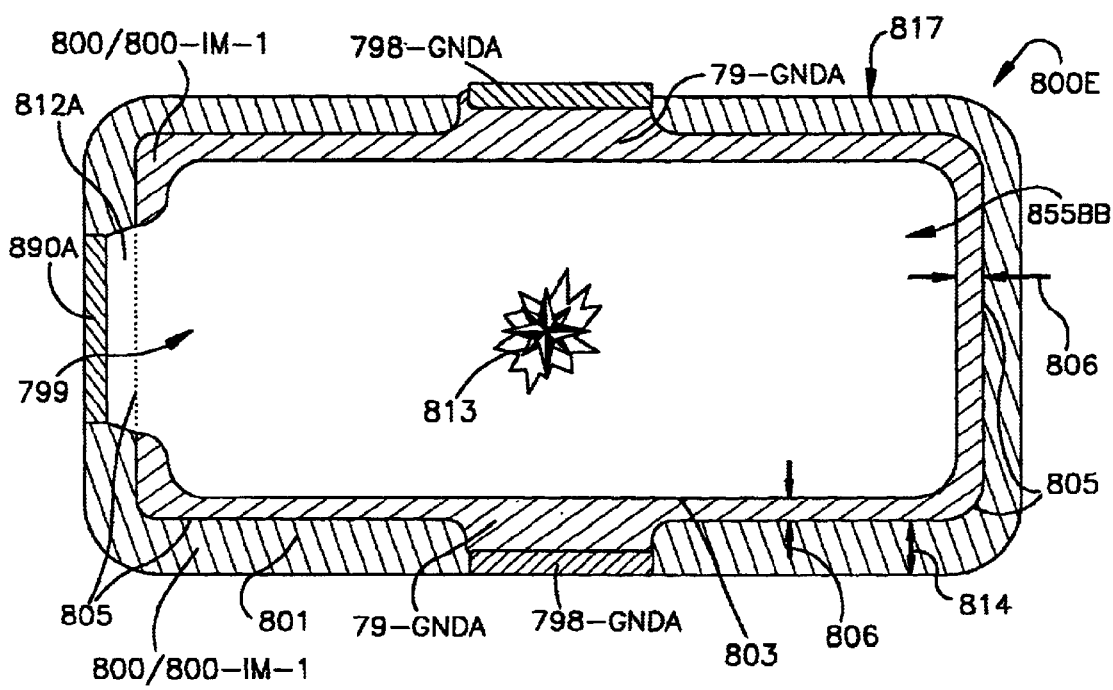
FIG. 1 shows a detailed plan view of a portion of a common conductive shielding electrode pathway and a differential electrode pathway stacking and positioning within a portion of universal faraday shield architecture embodiment 9900 with stacked conductive hierarchy progression, which is shown in FIG. 2 in accordance with the present invention.

Portions of co-pending and co-owned applications including application Ser. No. 09/594,447 filed Aug. 3, 2000, which is a continuation-in-part of co-pending application Serial No. 09/594,447 filed Jun. 15, 2000, which is a continuation-in-part of co-pending application Ser. No. 09/579,606 filed May 26, 2000, which is a continuation-in-part of co-pending application Ser. No. 09/460,218 filed Dec. 13, 1999, which is a continuation of application Ser. No. 09/056,379 filed Apr. 7, 1998, now issued as U.S. Pat. No. 6,018,448, which is a continuation-in-part of application Ser. No. 09/008,769 filed Jan. 19, 1998, now issued as U.S. Pat. No. 6,097,581, which is a continuation-in-part of application Ser. No. 08/841,940 filed Apr. 8, 1997, now issued as U.S. Pat. No. 5,909,350. are incorporated herein by reference.

This application also incorporates portions of co-pending and co-owned U.S. Provisional Applications herein by reference including U.S. Provisional Application No. 60/180,101 filed Feb. 3, 2000, U.S. Provisional Application No. 60/200,327 filed Apr. 28, 2000, U.S. Provisional Application No. 60/225,497 filed Aug. 15, 2000, U.S. Provisional Application No. 60/255,818 filed Dec. 15, 2000, as they all relate in one form or another to continued improvements to this new family of multi-functional energy conditioners and shield structures for energy propagating circuits.

As used herein, the term universal multi-functional common conductive shield structure plus two electrically opposing differential energy pathways refers to both discrete and non-discrete versions of a common conductive shield structure utilizing additional electrically opposing differential energy pathways for conductive feed-thru and by-pass, energy pathways.

In addition, as used herein, the acronym term "AOC" for the words "predetermined area or space of physical convergence or junction" which is defined as the physical boundary of manufactured-together invention elements. Non-energization and energization are defined as the range or degree to which energy within the "AOC" of either discrete or non-discrete versions of universal multi-functional common conductive shield structure plus electrically opposing differential energy pathways are propagating energy to and/ or from an area located outside the pre-determined in a complementary manner.

In electricity it is common for various interactions and interrelationships between energy propagations to be described in terms of their complementary dynamics brought about by pairs or pairings of energy portion elements with opposing energies and forces that are interacting from a polar opposition or electrically complementary state to each other. The results of these interactions are often un-recordable due to the limitations of the present day test equipment. Thus, interactions that are described as dynamic events, in complementary balance, by symmetry of pairings that are happening simultaneously, with the same, or complementary, mirror-like, reverse mirrored positionings and timings, etc. are made with the understanding that the one skilled in the art is aware that man-made tolerances and/or limitations used to described or record certain dynamics, while usually allowed by exact wording meanings, will not always have the recordability of the events on the scale of molecular or atomic-sized to the matter at hand.

In the quantum mechanical world, the principle of complementarity is the assertion that there exist pairs of quantities that are complementary in the sense that they describe a whole only when taken together, but which are mutually exclusive in that they can never be measured, simultaneously. They cannot, because the act of measuring one property creates a unity that contains the part being measured, the measurement, and the observer. This larger dynamic whole, in turn, defines a new dynamic "part" that is separate from, but coupled to, the original dynamic "part" or event being measured. These two dynamic "parts" are necessarily always mutually exclusive. No matter what we observe or how we design experiments, the dynamic "act "always manifests a new "part" that is outside the experiment, and coupled to it. In quantum mechanics, this principle leads directly to the well-known uncertainty principle that asserts there are fundamental limits on the accuracy obtainable in simultaneous measurements. The principle also limits the accuracies of simultaneous measurements of energy and of the time required to make the energy measurement.

To contrast with the Sciences with an example found in the Arts, an aesthetically pleasing integration of elements (as in a work of art) is usually achieved by giving each element only its due prominence or significance and often by allowing one element to stand in contrast to, oppose, or otherwise be matched by another. In the Arts, not Sciences, complementary is often used in a somewhat loose sense, to mean a kind of balance in which the corresponding parts are not necessarily alike but only similar. The effect can be described as not only contrasting, but complementary.

A symmetrical design should produce a pleasing effect; if there is too close a correspondence, the effect may be monotonous. A mathematical operation, or transformation, that results in the same figure as the original figure (or its mirror image) is called a symmetry operation. Such operations include reflection, rotation, double reflection, and translation. The set of all operations on a given figure that leave the figure unchanged constitutes the symmetry group for that figure.' Therefore, a limit on the combined accuracy of certain pairs of simultaneous, related measurement generally speaking, a balance or correspondence between various parts of an object; the term symmetry is used in the sciences and the stability or efficiency resulting from the equalization or exact adjustment of opposing forces should be taken into account.

These definitions should also be taken with a normally imposed uncertainty principle, limited by the degree of accuracy imposed by present test equipment and are not necessarily noticeable on the large scale of ordinary measurements, examination of the smaller structure or the operation of the combination. Measurements or declarations stating cancellation or suppression mean in the ordinary sense of the understanding all with manufacturing in mind in terms of the structures shape and size and with the understanding that the events as foretold have happened even if a device cannot measure or confirm it as cold fact.

These concepts, as stated above of belies the difficult subject it is to just describe with a few mere words, various degrees of limitations of meanings to an event. This is no excuse, rather, the use of words known that could be considered strict or definitive, are nevertheless used herein with the anticipation and forethought that the reader or a one skilled in the art has or will take these words, adjectives, adverbs and nouns with a degree of imprecision that is normally allowed.

Use of the such words as same, 'complementary simultaneous', 'same-time, same size, same sized, identical, equal, equal-sized, etc. should be understood with the preciseness of the real world as to what the words relied upon for explanation, all bearing upon the general understanding to what is considered a normal and a standard, and especially as well, to what is as practical for manufacturing tolerances as possible or as normally practice within the state of the art for the various OEM's who will actually construct the invention and its' variants described herein. Therefore, the variants as described, are all conceived under the light of a normal industry process with the various normal industry assembly limitations or any other normal industry limitations to normal industry manufacturing electronic of embodiments for energized circuits, not just as described for the invention and variant's described within the disclosure here, but given for all of the prior art.

The invention begins as a combination of electrically conductive, electrically semiconductive, and non-conductive dielectric independent materials, layered or stacked in various embodiments such as discrete and non-discrete structures. These layers can be combined to form a unique circuit when placed and energized in a system. The invention embodiments include layers of electrically conductive, electrically semi-conductive, and non-conductive planes that form groups of common conductive pathway electrodes, conductors, deposits, plates (all referred to as 'pathways', herein), and dielectric planes. These layers are oriented in a generally parallel relationship with respect to one another and to a predetermined pairing or groups of elements that also include various combinations of pathways and their layering into a predetermined manufactured structure.

These invention elements are not just limited to dielectric layers, multiple electrode conductive pathways, sheets, laminates, deposits, multiple common conductive pathways or shields, sheets, laminates, or deposits. The invention also includes methods to combine and connect said dielectric layers, multiple electrode conductive pathways, sheets, laminates, deposits, multiple common conductive pathways, or shields, sheets, laminates, or deposits, together for energization into a larger electrical system in a predetermined manner.

When or after the structured layer arrangement is manufactured, it can be shaped, buried within, enveloped, or inserted into various electrical systems or other sub-systems to perform line conditioning, decoupling, and/or aid in modifying an electrical transmission of energy. The invention can be a separate, stand-alone embodiment or manufactured as a group, integral to a larger electrical structure, such as an integrated circuit. The invention can also exist as a non-energized, stand alone, discrete device that is energized with a combination, as a sub-circuit for larger circuitry found in other embodiments such as, but not limited to, printed circuit boards (PCB), interposers, substrates, connectors, integrated circuits, optical circuits, or atomic structures. An alternative invention embodiment can also be built primarily as another device such as a PCB, interposer, or substrate that has a purpose mainly other than that of a smaller discrete version of an invention embodiment. This type of alternative embodiment can serve as a possible system or subsystem platform that contains both active and passive components along with circuitry, layered to provide most of the benefits described for conditioning propagated energy from a source to a load and back to a return. Prior art PCBs are already utilizing predetermined layered configurations with VIAs to service or tap the various power, signal, and ground layers that lie between a dielectric and insulating material.

At least one pair of electrically opposing complementary aligned and stacked conductive energy pathway electrodes are almost all surrounded with symmetrically aligned and stacked shielding electrodes combined in a electrode cage-like structures comprising at least one centralized and shared, common conductive pathway or area. At energization, the internal/external common energy pathway electrodes and/or area becomes a shared reference ground plane for the circuit voltage existing between the two oppositely phased or electrically opposing differential conductive energy pathway electrodes, which are electrically and physically located on opposite sides of the common energy pathway electrodes as well as the centralized and shared, common conductive electrode pathway or external common conductive area. These types of configurations aid significantly in suppressing E-Fields and H-fields, stray capacitances, stray inductances, parasitics, and allowing for mutual cancellation of electrical fields of the variously positioned signal, power and return pathways. A PCB built or utilizing an embodiment variation of the invention architecture can utilize the various grounding schemes to increase the efficiency of existing structures now used by large PCB manufacturers.

To propagate electromagnetic interference energy, two fields are required, an electric field and a magnetic field. Electric fields couple energy into circuits through the voltage differential between two or more points. Changing electrical fields in a space give rise to a magnetic field. Any time-varying magnetic flux will give rise to an electric field. As a result, a purely electric or purely magnetic time-varying field cannot exist independent of each other. A passive architecture, such as utilized by an invention embodiment, can be built to condition or minimize both types of energy fields that can be found in an electrical system. While an invention embodiment is not necessarily built to condition one type of field more than another, it is contemplated that different types of materials can used to build an embodiment that could do such specific conditioning upon one energy field over another.

As for almost all embodiments of the present invention depicted and those not pictured, the applicant contemplates a manufacturer to have the option of combining a variety and wide range of possible materials that are selected and combined into the make-up of an invention embodiment when manufactured, while still maintaining some or almost all of the desired degree of electrical functions of an invention embodiment.

Materials for composition of an invention embodiment can comprise one or more layers of material elements compatible with available processing technology and is not limited to any possible dielectric material. These materials may be a semiconductor material such as silicon, germanium, gallium-arsenide, or a semi-insulating or insulating material and the like such as, but not limited to any K, high K and low K dielectrics. Equally so, an invention embodiment is not limited to any possible conductive material such as magnetic, nickel-based materials, MOV-type material, ferrite material, films such as Mylar, or almost any kind of substances and processes that can create conductive pathways for a conductive material, and almost any kind of substances or processes that can create conductive areas such as, but not limited to, doped polysilicons, sintered polycrystallines, metals, or polysilicon silicates, polysilicon silicide, conductive material deposits.

Use of an invention embodiment or unit attached between energized, paired lines will alleviate problems of capacitive imbalance or circuit voltage imbalance, or, manufacturing imbalances usually associated with prior art devices that are accentuated at high frequency operations.

Prior art capacitors manufactured in the same production batch can easily posses a variability in capacitance from component to component, ranging anywhere from >0.05%–25%. Thus, when prior art capacitors are placed into a circuit and energized, their manufacturing tolerances are carried to the circuit and in this case, a differential paired circuit for example, exacerbate a voltage imbalance in the circuit. Even if prior art units are manufactured to obtain minimal variations in capacitance of less than 10% between discrete units, a cost or a substantial premium must be paid by the user in order for the manufacturer to recover the costs for testing, hand sorting manufactured lots, as well as the additional costs for more specialized dielectrics and manufacturing techniques that are needed to produce prior art units with reduced individual variance differences required for differential signaling or filtering. The invention allows the use of very inexpensive dielectric materials (relative to the others available) to obtain balance between two lines.

Use of an invention embodiment will allow placement into a differentially operated circuit or almost any electrically opposing and differentially paired line circuitries to provide complementary and essentially, equal capacitive tolerances, attributed to a invention unit, that will be shared evenly and complementary by portions of propagating energies found between each paired line of the circuit utilizing an invention embodiment in an electrical manner. Invention voltage tolerances and/or capacitive and inductive balance/ and or minimizations between a commonly shared central conductive pathway found internally within an invention embodiment will almost always be relatively maintained at levels that originated at the factory during manufacturing of an invention embodiment, even with the use of X7R dielectric, which is commonly specified with as much as 20% allowable capacitive variation amongst discrete units.

Thus, an invention that is manufactured at a value larger than 0 to at least a 5% tolerance, when manufactured as described in the disclosure will almost always also have a correlated a value larger than 0 to at least a 5% tolerance, capacitive tolerance between paired lines in an energized system and an added benefit exchange of two prior art devices for bypassing paired lines with one said invention embodiment. Thus, expensive, specialized, dielectric materials are no longer needed for bypass and/or decoupling operations in an attempt to maintain a capacitive balance between two system conductive pathways, as well as allowing an invention user the opportunity to utilize a capacitive element that is homogeneous in material make up within the entire circuit. The new invention is placed between conductive pathways, while the common conductive pathways that also make up an invention embodiment are connected to a third conductive pathway that is common to all elements of the common conductive pathways and is the external conductive area.

When the universal multi-functional common conductive shield structure plus two electrically opposing differential energy pathways is manufactured and subsequently attached to an externally manufactured conductive pathway that is separate (not of) from the electrically opposing differential energy pathways that are also utilizing an invention embodiment, an invention embodiment will almost always simultaneous provide energy conditioning functions that include at least bypassing, energy, power line decoupling, energy storage and filtering. Such that within the invention embodiment almost all of the electrically opposing differential energy pathways or electrodes are almost completely enveloped within the shield structure and will almost always be relatively free from almost all internally generated capacitive or energy parasitics trying to escape from the enveloped containment area surrounding the enveloped differential conductive pathway electrode. At the same time, the universal multi-functional common conductive shield structure acts to prevent almost any externally generated capacitive or energy parasitics such as "floating capacitance" from coupling onto the very same enveloped differential conductive pathways due to the physical shielding, separate of the electrostatic shield effect created by the energization of the common conductive shield structure and its attachment by commonly known industry attachment means know to the art to an externally located common conductive area.

Attachment to a common external conductive area includes areas such as commonly described as a "floating', un-potential conductive area (at a given moment), a circuit system return, chassis or PCB ground, or even an earth ground. Through other functions such as cancellation of mutually opposing energy fields and internally connected parallel circuitry, an invention embodiment allows a low impedance pathway to develop upon and within the Gauss-Faraday cage-like or common conductive shield structure unit with respect to its enveloping conductive common shields pathway electrodes that can subsequently facilitate or allow for the continue d movement of portions of energies out onto an externally located common conductive area, thus completing a creation or facilitation of development of an energy pathway of low impedance for utilization of unwanted EMI noise, as well.

This attachment scheme will almost always allow a "0" voltage reference to develop on opposite sides of the shared central and common conductive pathway, with respect to each differential conductor located, each of its (differential conductor) structures and the externally used common conductive surface. Use of an invention embodiment allows voltage to be maintained and complementary even with SSO (Simultaneous Switching Operations) states among gates located within an integrated circuit and without contributing disruptive energy parasitics back into the circuit system as an invention embodiment is passively operated, within said circuit system.

Thus, parasitics are prevented or minimized from upsetting the capacitive balance that was manufactured into the unenergized invention and is contrary to what occurs with every other prior art unit not using the conductive shield structure. Prior art has usually allowed effects from free parasitics to disrupt a circuit despite the best attempts to the contrary with almost all prior art devices to date.

As previously, noted, propagated electromagnetic interference can be the product of both electric and magnetic fields, respectively. Until recently, emphasis in the art has been placed upon on filtering EMI from circuit or energy conductors carrying high frequency noise with DC energy or current. However, an invention embodiment is capable of conditioning energy that uses DC, AC, and AC/DC hybrid-type propagation of energy along conductive pathways found in an electrical system or test equipment. This includes use of an invention embodiment to condition energy in systems that contain many different types of energy propagation formats, in systems that contain many kinds of circuitry propagation characteristics, within the same electrical system platform.

It should be noted, that although not shown, the various electrode layerings in FIGS. 2,3,8, and FIG. 9 are contemplated to have either split electrode configurations or combinations with other non-split electrode configurations. Due to the interest of time, the various combinations have been omitted in this disclosure for specific drawings.

Principals of a Faraday cage-like structure are used when the common conductive pathways are joined to one another and the grouping of said pathways co-act together with the larger, external conductive area or surface to suppress radiated electromagnetic emissions and provide a greater conductive surface area in which to dissipate over voltages and surges and initiate common conductive electrode cage-like electrostatic dynamic suppression of parasitics and other transients, simultaneously, when a plurality of common conductive pathways are electrically coupled to system or chassis ground and are relied upon for reference ground for a circuit in which an invention embodiment is placed into and energized. Electrically opposing differential conductive energy electrodes or structures are separated electrically and also shielded from one another and normally do not touch within an invention embodiment.

Attached, internal common conductive electrode pathways that make up a Faraday cage-like structure allow a common external conductive area or common energy pathway to become, in essence, an extended, closely positioned, and essentially parallel arrangement of said common conductive elements with respect to their position, if located internally within a pre-determined layered PCB or similar electronic circuitry at subsequent energization.

Figure 2:
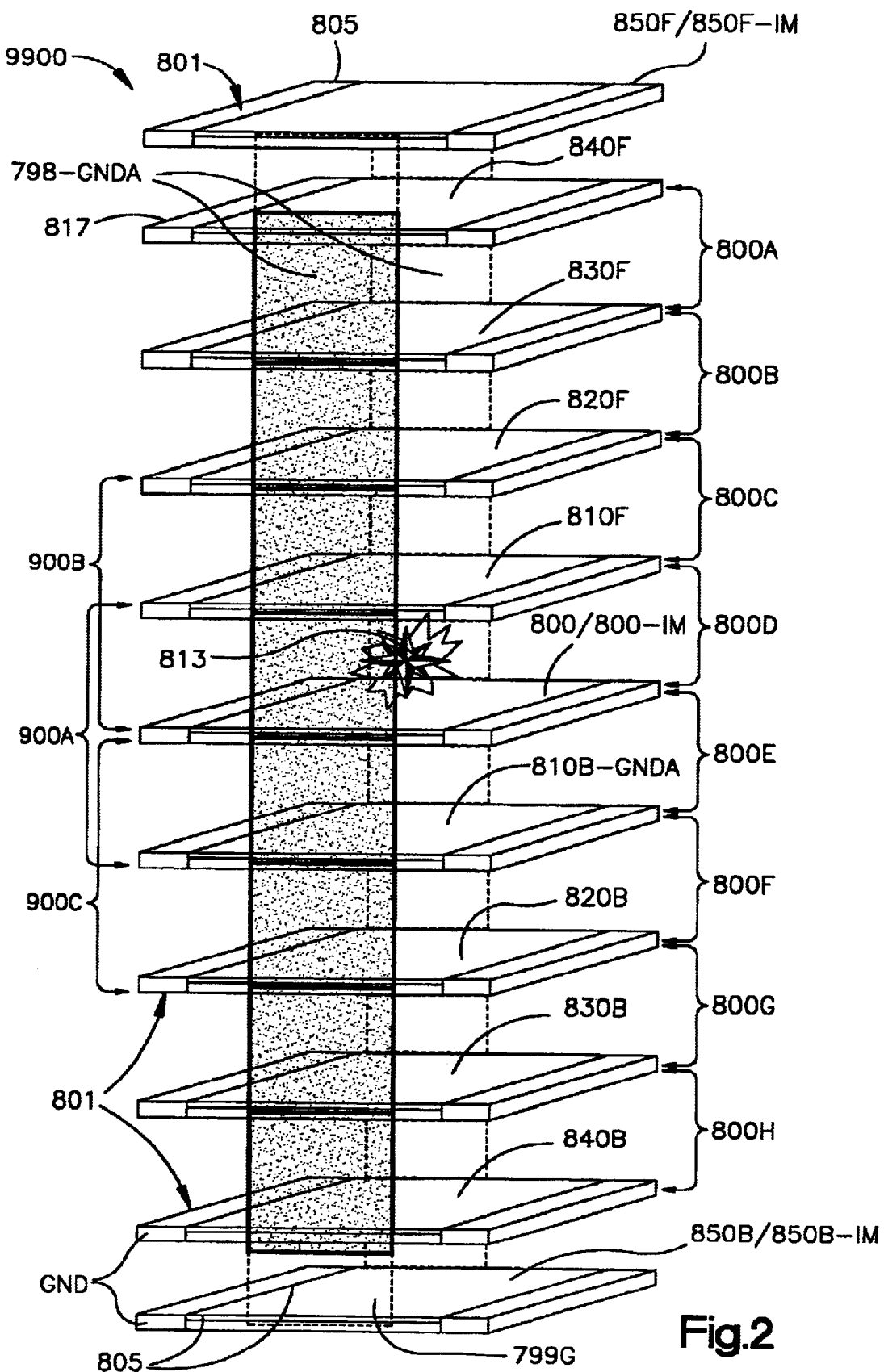
FIG. 2 shows portion of an exploded perspective view of an embodiment of universal faraday shield architecture 9900 with electrode stacked conductive hierarchy progression in accordance with the present invention.
Figure 3:
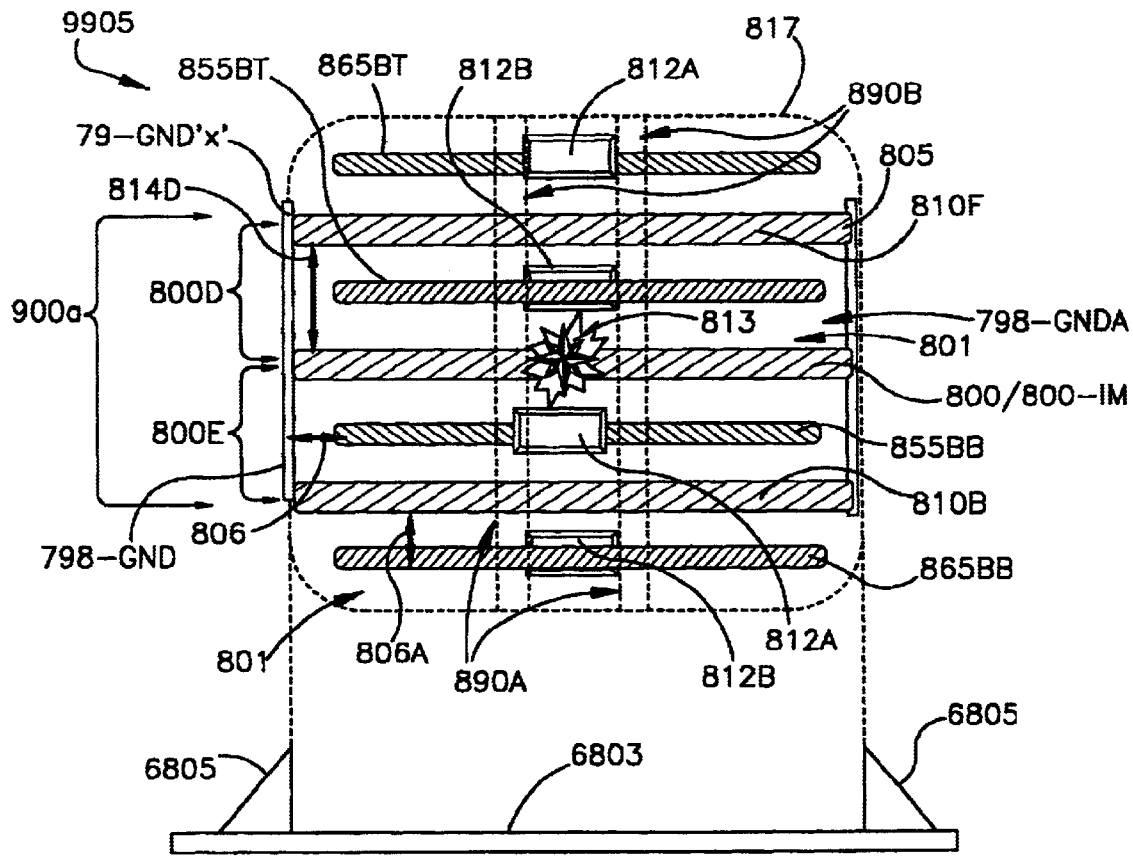
FIG. 3 shows portion of a cross-section view of paired differential bypass circuit conditioning embodiment 9905 utilizing one embodiment portion of a universal faraday shield architecture with electrode stacked conductive hierarchy progression for energy conditioning of multiple and separate bypass circuits in accordance with the present invention.

Portions of a universal faraday shield architecture with stacked conductive hierarchy progression with paired; electrically opposing differential conductive pathways are shown in detail in FIG. 1, FIG. 2, and FIG. 3. Accordingly, discussion will move freely between FIG. 1, FIG. 2, and FIG. 3 in order to disclose the importance a portion a paired differential conductive pathway independent and interchangeably configured Faraday-cage-like common conductive shield structure like an embodiment 9905 shown in FIG. 3 which can allow for multiple yet independently operating energy conditioning when placed in conductive combination with various internal and external common conductive pathways (not fully shown) in FIG. 1, FIG. 2, and FIG. 3.

In FIG. 2, common conductive shielding electrode pathways, 850F/850F-IM, 840F, 830F, 820F, 810F, 800/800-IM, 810B, 820B, 830B, 840B and 850B/850B-IM comprise an embodiment of a universal faraday shield architecture with stacked conductive hierarchy progression shown without the paired, electrically opposing differential conductive pathways in embodiment 9900 Final and optional sandwiching 850F/850F-IM and 850B/850B-IM common conductive shielding pathways which are used as image shields depicted in embodiment 9900 and as a portion of a variation, shown in 9905 of FIG. 3 using species of common electrode pathways which can also be found to comprise a portion of a universal faraday shield architecture with stacked conductive hierarchy progression with conductive differential pathways, if desired.

It should be noted that most, but not all, of the general principals described herein, would be universal with the new invention and alternative embodiments. The sections that reference to common conductive pathway 800/800-IM also apply to the other common conductive pathways in terms of connecting to the same electrically potential external common pathway not of the external differential pathways (both not shown in FIG. 1 and FIG. 2).

To begin, FIG. 1 shows a portion of the complete shielding electrode container 800E of FIG. 2. Referring back to FIG. 1, differential conductive by-pass electrode pathway 855BB is sandwiched between the shared, central common conductive pathway 800/800-IM and common conductive shielding electrode pathway 810B (810B is not shown in FIG. 1, but 810B is shown in FIG. 2).

Positioned above and below pathway 855BB is a dielectric material or dielectric medium 801. Depositing, manufacturing and/or act of positioning dielectric material or dielectric medium 801 is for the most part, a general enveloping and interposition of the predetermined dielectric material or medium 801 during the manufacturing process by standard means known in the art.

Dielectric material 801 forms an area or space of separation 814 between embodiment edge 817 and common electrode pathway edge 805 as well as a generally equal distance spacing with respect the differential conductive pathways electrode edges 803 and embodiment edge 817. Common conductive pathways 800/800-IM and 810B, as well as electrode pathway 855BB, are almost all separated from each other for the most part by a general parallel interposition and distance 814C with a predetermined dielectric material or medium 801 positioned against them. The 814C distance exists on at least two sides of the boundary or surface or surface edge 803 of 855BB and 805 of 800-/800-IM- 1 & 2, each respective planar electrodes (2) principal surface areas as well as each perimeter edges as described contact for the most part with material 801, except where the various conductive connections are made to the various electrode connection materials 798-GNDA and 890A respectively by way of the elongated portions 812A and 79GNDA, respectively for each conductive electrode layered position.

It should be noted that the inset distance or area of element 806 is the boundary for the containment area of the energy flux portions during energization and this spacing is almost always relative to both perimeter common shielding electrode edge 805 and to sandwiching common conductive shielding electrode pathways and to electrically opposing differential electrode edge 803 of almost any of the sandwiched differential conductive electrode pathways (not all shown). This positioning and setback distance 806 of almost any differential conductive electrode pathway electrode edge 803 within common electrode edges' 805 of almost any of the invention embodiments' common shielding electrode pathway 799G conductive material area is considered an axiom of an invention embodiment. This axiom goes for almost any paired, differential conductive pathways comprising and utilizing a shielding electrode hierarchy structure whether in a container or external of the shielding 800"x" container such as shown in FIG. 3 and includes at least one pair of outer electrically opposing differential electrodes found beyond the shielding electrode hierarchy structure yet are both outer electrically opposing differential electrodes shown in FIG. 3 will almost always be utilizing to some degree the shielding electrode hierarchy structure in a shielding manner in either a discrete or non-discrete version of an embodiment (which may not be shown, herein).

To begin, a portion of an invention embodiment like that shown in FIG. 2 and after beginning from FIG. 1, two single, common conductive containers 800"X" are now formed with two common conductive shields each, respectively. However, in manufacturing process rather than using four common shield electrodes, one can create two common conductive shielding electrode containers with three shielding electrodes to create 800E and 800F for example. Thus, each single common conductive container 800E and 800F is sharing a centrally positioned shielding electrode pathway that is common to both conductive shielding electrode structures and containers, which in turn make up in this case a common conductive Faraday center structure designated 900A.

It should be noted that as well as forming common conductive Faraday center structure 900A, portions of common conductive shielding electrode structures designated respectively as 900 "X" or like 900B and 900C of the much larger common conductive shielding electrode structure 9900 are now created.

Common conductive shielding electrode structures 900A, 900B and 900C as shown in FIG. 2, would each, alone, operate sufficiently as one common conductive Faraday cage-like structure with electrically opposing differential electrodes, if built as such, individually and if they include at least one pair of outer electrically opposing differential electrodes separated by the same common conductive Faraday cage-like structure and found beyond the inside of the shielding electrode hierarchy structure, they will almost always still be both utilizing to some degree the shielding electrode hierarchy structure in a shielding manner in either a discrete or non-discrete version of an embodiment (which may not be shown, herein).

When an invention embodiment utilizes placement of the respectively paired, electrically opposing differential energy pathways (not shown) and energized, and if, a structure like either 900A, 900B and 900C are also connected together and to a external common energy pathway and not of the electrically opposing and external differential energy pathways, energy conditioning functions will almost always occur when attached into energized circuitry.

The relative inset or overlapping shielding distance and area 806 relative to the insetting of electrode 855BB within 800/800-IM- of FIG. 1 enables an electrostatic shielding effect, among others, to function from this positioning relationship and among various element relationships within an invention embodiment. Some of these space/distance relationships comprise among others, vertical positioning of electrodes of almost all species (differential and common) relative to one another and by the separation dielectric material 801 amounts used in terms of spacing these electrodes from one another and within, the respective relative horizontal positioning to internal electrode positions. This also includes the various spacing and distances relationships with respect to external embodiment borders or energy conditioning functions and their effect within these borders that are needed for the proper energy conditioning interactions that take place within these positioning and borders. It should be noted that the common conductive pathway 800/800-IM should extend in a perimeter or edge overlapping distance beyond the perimeter or edge of be electrode pathway 855BB to provide shielding against portions of various types of energy flux fields (not shown) which might have normally attempted to escape or extend beyond the electrode edge 803 of the electrode pathway 855BB to couple upon a "victim" conductive pathway (not fully shown) but were it not for common electrodes 800/800-IM-, 810F.

The electrostatic shielding effect created by an energized, grouping of these common electrode pathways comprise a grouping of faraday-like cage systems which result in a reduction or a minimization of near field coupling between almost any internally positioned differential electrode pathways such as 875BB (not shown) which would generally be positioned nearby. The horizontal electrode inset distance 806 can be stated to range between approximately greater than >0 to 20+ times the vertical distance or electrode inset distance or 814C as the approximate measured inset spacing of a differential to a common electrode shielding inset 806 which creates a certain distance relationship between the electrode pathway 855BB and the common conductive pathway 800/800-IM. This is based on standard manufacturing methods and distance.

Or in other words, the principal surface electrode conductive area size, less the elongated portions, (if used), or conductive plane size of almost any neighboring differential electrode pathway will almost always be less in the corresponding principal surface electrode conductive area size, less the elongated portions, (if used), or conductive plane size than any of one of the common conductive shielding electrode pathway that is adjacent and parallel to it, regardless of almost any other elements separating these two adjacent invention elements other than another differential electrode (such as with split electrode mate). This means that despite dielectric material 801 or a split differential electrode mate, the next adjacent common conductive shielding electrode pathway will almost always be at least larger in coverage size and will be considered shielding the same adjacent differential electrode.

There is one size exception as a general rule and it is only applicable to at least the outer sandwiching differential electrode pathways like shown with 865BB and 865BT of FIG. 3. These special outer sandwiching differential electrode pathways can be larger or smaller in conductive area size, conductive material coverage or conductive plane size than its adjacent common conductive shielding electrode pathway(s) and further, these outer sandwiching differential electrode pathways 865BB and 865BT of FIG. 3C do not need to be identical in size with respect to one another due to other invention electrical function variation configurations.

Thus, unless any paired set of differential electrode pathways are same in the general corresponding conductive principal electrode surface area sizes, principal electrode conductive material coverage's or conductive plane sizes as any of the next adjacent common conductive shielding electrode principal electrode surfaces or pathway(s), variations of this axiom are considered an invention embodiment possessing portions of the energy conditioning functions as disclosed.

The electrode inset distance 806 can be optimized for a particular application, but the general perimeter distances of common/differential electrode overlap 806, distances 814, 806A and 814C among each respectively contained differential electrode to common shielding electrode pathway pairings and overlap relationships are ideally, approximately the same throughout an invention embodiment, as manufacturing tolerances will allow.

Figure 7A:
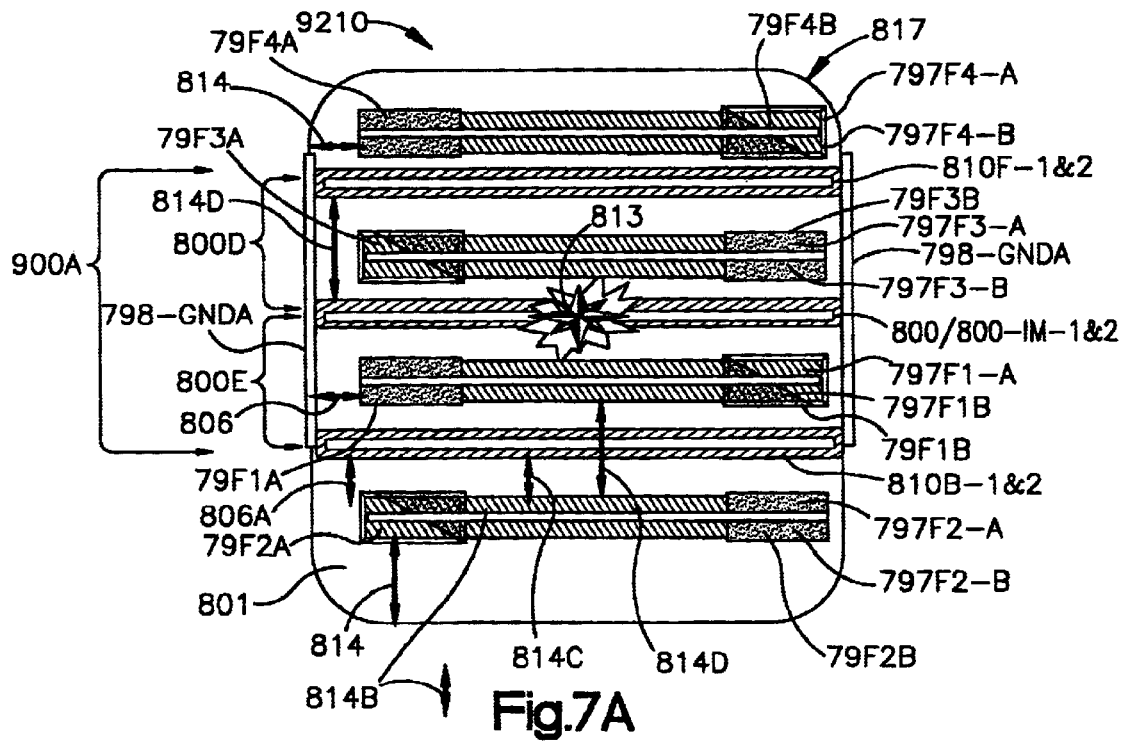
FIG. 7A shows portion of a further alternate embodiment 9210 in a cross-sectional view that comprises two pairs of electrically opposing differential, twisted pair, crossover feedthru electrode energy pathways configured in accordance with the present invention.

In addition, the internal differential conductive electrode pathways like 855BB which are sandwiched within the conductive areas of two common conductive pathways such as 800/800-IM and 810B (not shown) of FIG. 3, maintain an 806 distance relationship between the electrode edge 803 of differential conductive electrode 855BB which will be relative to the perimeter electrode edge 805 of common pathway electrode 800/800-IM, such that electrode edge 805 enjoys a perimeter which is exposed or "peeking out" beyond electrode edge 803 by at least the vertical separation distance 814C as shown in FIG. 7A of the disclosure which shows a relative dielectric thickness that allows a distance or area inset to be a rule related to a relative horizontal distance for 806 which is a result of adding to the three-dimensional distance 806 from the common conductive shielding electrode edge 805 when measured with respect to the differential electrode pathway electrode edge 803 of 800E such that the outer electrode edge 803 of differential conductive pathway electrode 855BB is inset and interposition between and overlapped by a common electrode edge perimeter 805 of sandwiching common conductive pathways 800/800-IM and 810B (not shown) and covering a distance or an area 806, along almost the total perimeter distances of 805 and 803 located on and attributed to both 800/800-IM , 810B while relative to a sandwiched differential conductive energy electrode pathway 855BB or equivalent. Minor or slight differences of 806, 814 and 814C distances or areas are unimportant between the pathways as a whole or individually, as long as electrostatic shielding function (not shown) of universal faraday shield architecture with stacked conductive hierarchy progression comprising paired, electrically opposing differential conductive pathways is not compromised.

It is desired that common conductive shielding electrode pathways such as 850F/850FIM, 840F, 830F, 820F, 810F, 800/800-IM, 810B, 820B, 830B, 840B and 850B/850B-IM shown in FIG. 1, FIG. 2 and for the series depicted in FIG. 3 for example, will generally almost all possess nearly the same sized area of common conductive shielding electrode pathway material 799G, respectively, for the type of finished embodiment desired by the user and as normal manufacturing limitations allow in order to insure a homogenous area size relationship for almost any combination of various neighboring common conductive pathways. This goes for a size relationship with respect to each member of the common conductive pathways that are grouped as shielding electrodes, respectively, in almost any general invention embodiment make-up. Thus, any one, sandwiched internally positioned differential conductive pathway, both singularly and with its' same sized, paired mate, will almost always be completely shielded, physically by at least any two larger, but same sized-common conductive shielding electrode pathways relative and respectively to one another and both of which will be almost always comprised of a larger total shielding conductive electrode area than that of the differential electrode they shield. This same sized-common conductive shielding electrode axiom holds to the size relationship of the at least same sized or larger conductive material area of a common electrode energy pathway element relative to the conductive area size of any sandwiched differential conductive pathway or electrodes(s) within almost any of the inventions' Faradaycage-like common conductive shield structure containers such as those designated 800A, 800B, 800C, 800D, 800E, 800F, 800G, and 800H as depicted in FIG. 2 and partially in FIG. 3 (each referred to generally as 800'X').

It should also be noted that almost any one of the sandwiching common conductive pathways' will posses a total top and bottom conductive material area sum almost always greater than the total conductive area material sum, top and bottom, of almost any one-sandwiched differential conductive pathway, alone. Any one of the sandwiched, differential conductive pathways will almost always be almost completely physically shielded by common conductive shielding electrode material area so to partially makeup typical universal faraday shield architecture with stacked conductive hierarchy progression comprising paired, electrically opposing differential conductive pathways.

All of the conductive common conductive pathways shown in FIG. 1 and FIG. 2, including common conductive shielding pathway electrodes 850F/850F-IM, 840F, 830F, 820F, 810F, 800/800-IM, 810B, 820B, 830B, 840B and 850B/850B-IM are normally inset a predetermined three dimensional distance 814 from the outer edge 817 of embodiment 9905 (not shown) but this can be seen in detail with 800E of FIG. 1.

It should be noted that element 813 is a dynamic representation shown of the center axis point of the three-dimensional energy conditioning functions that take place within an invention embodiment (not shown) are relative with respect to the final size, shape and position of the embodiment in energized circuitry.

Thus, paired and same sized electrically opposing, differential conductive pathways, along with the larger sandwiching common conductive pathways, like 800/800-IM and 810B of FIG. 2 will be almost always generally of the same size, respectively, per homogeneous species groupings (Common or differential pathways) to one another within the same species grouping, as relative manufacturing capabilities will allow. This same-sized conductive pathway electrode species axiom is good for almost all conductive pathway species groups, which comprise some of the main elements within the general make-up of almost any new invention embodiment.

Continuing back with FIG. 1, differential conductive electrode pathway 855BB can comprise a deposited, doped, chemically created or placed, or simply screened on conductive electrode material area 799 of any differential conductive pathway will almost always be less in total conductive area size than any of one common conductive shielding electrode material area 799G size, and almost always relative to of any given sandwiching common conductive pathways' such as 800/800-IM and 810Bs', conductive electrode pathway material 799 area when calculating a ratio of total conductive electrode material areas. (It should be noted that 799 and 799G are normally identical conductive material types disclosure purposes and although in other embodiments they could be of different material types, they are of the same type, herein but labeled differently in order to explain the embodiments as thoroughly as possible.).

The sandwiching function of these 850F/850F-IM, 840F, 830F, 820F, 810F, 800/800-IM, 810B, 820B, 830B, 840B and 850B/850B-IM shown in FIG. 2 that make up shielding electrode containers 800A, 800B, 800C, 800D, 800E, 800F, 800G, and 800H up to that envelope the differential pairs to make up essential groupings of paired conductive shield-like containers 800X will again aid to a good degree in performing the portions of energy propagation relative to the externally attached, common conductive area or common energy pathway and will simultaneously allow for creation of voltage image reference aids for circuits contained within the invention embodiment.

It should be noted that equal numbers of shielding electrode container structures 800'X' that make up part of an invention embodiment are in balance within the embodiment structure according to a followed predetermined stacking sequence and that almost any additional or extra single common conductive shield pathway layers that are added by mistake or with forethought during the manufacturing process will not sufficiently hamper or degrade energy conditioning operations. An added extra common conductive electrode layering can actually reveal a potential cost savings in the manufacturing process wherein almost any automated layer processes could possibly added the additional outer layer or layers as described or actually not include one of the two designated—IM common conductive shield electrodes. It is disclosed that these manufacturing errors whether intentional or accidental, will not overwhelmingly harmful to the balance integrity of an invention embodiment comprising the properly sequenced stacking of common conductive shielding electrode containers designated 800X. as discussed and is fully contemplated by the applicants. However, this axiom is not true when the additional outer separated paired and same sized, electrically opposing, differential conductive pathways are in position. In this case it is essential that the equal numbers of shielding electrode container structures 800'X' that make up part of an invention embodiment are in balance within the embodiment structure according to a followed predetermined stacking sequence. There should be no additional or extra single common conductive shield pathway layers placed before application of the additional outer separated paired and same sized, electrically opposing, differential conductive pathways. Thus almost any additional or extra single common conductive shield pathway layers, individually, that are added by mistake or with forethought before positioning the additional outer separated paired and same sized, electrically opposing, differential conductive pathways during the manufacturing process will hamper or degrade energy conditioning operations. The number of paired and same sized, electrically opposing, differential conductive pathways within almost any variation of an invention embodiment must be even in number.

By further looking at FIG. 2, it is seen that common conductive shielding electrode pathways, 850F/850F-IM, 840F, 830F, 820F, 810F, 800/800-IM, 810B, 820B, 830B, 840B and 850B/850B-IM are also surrounded by dielectric material 801 that provides for support and the outer casing of the invention embodiment when configured as a discrete component. The common conductive connection material or structures designated 798-GND'X', are applied to a elongated, contiguous portion of said common shield pathway electrode extension 79-GNDA at electrode edges 805 of common pathway electrode material 799G of contained within structure 9900 on at least two sides as shown for this configuration and as is depicted in FIG. 2 and as is depicted in detail for common electrode energy pathway 800/800-IM in FIG. 1. It should be noted that the number of common shield pathway electrode extensions 79-GNDA at any of the common electrode edges 805.

Various dielectric materials 801 also enable predetermined electrical conditioning functions to operate upon portions of propagating energies transporting along the various combinations of electrically opposing and paired differential conductive energy pathways that are within or utilizing the embodiment AOC.

A further look at FIG. 2 reveals element type 798-GND'X' common conductive attachment means, electrode or termination structure will allow electrical and physical connection of common conductive pathway energy electrodes, 850F/800F-IM, 840F, 830F, 820F, 810F, 800/800-IM, 810B, 820B, 830B, 840B and 850B/850-IM, respectively, to each other and to the same electrically conductive external common conductive pathway or external common conductive energy pathway or area 6803 as depicted in FIG. 3. This new common energy pathway created is not of the differential pathways (not shown) and is utilized for the development or the creation of a third, common conductive energy pathway, external (not shown) to an invention embodiment and of 798-GND'X' common conductive attachment, such as an electrically conductive material, electrode or termination structure.

The universal, multi-functional, common conductive shield structure 9900 comprises multiple, stacked, common conductive cage-like structures 900A, 900B and 900C as depicted and which in turn are comprised of multiple, stacked, common conductive cage-like structures or containers 800A, 800B, 800C, and 800D (each referred to generally as 800X), in a generally parallel relationship. Each common electrode shielding, cage-like structure 800X comprises at least two common conductive pathway electrodes, 850F/800F-IM, 840F, 830F, 820F, 810F, 800/800-IM, 810B, 820B, 830B, 840B and 850B/850-IM. The number of stacked, common conductive cage-like structures 800X is not limited to the number shown herein, and can be almost any even integer in number. Thus the number of stacked, common conductive cage-like structures 900X is also not limited to the number shown herein and could be of an even or odd integer.

Although not shown, in other applications, each paired common conductive cage-like structure 800X sandwiches at least one conductive pathway electrode as previously described in relation to FIG. 1. The common conductive cage-like structures 800X are shown separately to emphasize the fact they are paired together and that almost any type of paired conductive pathways can be inserted within the respective common conductive cage like structures 800X. As such, the common conductive cage-like structures 800X have a universal application when paired together to create larger common conductive cage-like structures 900X, which are delineated as 900B, 900A and 900C, respectively and can be used in combination with paired conductive pathways in discrete, or non-discrete configurations such as, but not limited to, embedded within silicone or as part of a PCB, discreet component networks, and the like.

As has described in FIG. 2, the dielectric material 801, conductively separates the individual common conductive pathway electrodes 850F/800F-IM, 840F, 830F, 820F, 810F, 800/800-IM, 810B, 820B, 830B, 840B and 850B/850-IM, from the paired and same sized, electrically opposing, differential conductive pathways or conductive pathway electrodes (not shown) sandwiched therein and also conductively separates as well as shields the outer at least one pair of same sized, electrically opposing, differential conductive pathways.

In addition, as described in relation to FIG. 1 and FIG. 2, a minimum of two cages, for example 800E and 800D, which make up larger cage 900A, are required to make up a multifunctional line-conditioning structure for use in almost all of the layered embodiments of the present invention. Accordingly, there are a minimum of two required common conductive cage like structures 800X, as represented in FIG. 2 per each 900A, 900B, and 900C, respectively. The very basic common conductive pathway manufacturing result of any sequence (excluding dielectric materials, etc.) should appear as an shielding electrode embodiment structure that comprises a minimum of three common conductive interconnected common shielding electrode pathways stacked and further comprising, at least two sets of pairings of electrically opposing, differential electrode energy pathways, one set paired and internal within the minimum of three common conductive interconnected common shielding electrode pathways and one set paired and external to the minimum of three common conductive interconnected common shielding electrode pathways that can be connected an energized such that it will contain at least on portion of an operating, electrical circuit when energized.

In summary, generally, when a single, larger Faraday-cage-like structure 900'X' is attached to a larger external conductive area (not shown), the combination helps perform simultaneously, energized line conditioning and filtering functions upon the energy propagating along the various paired groupings of electrically opposing differential conductive electrodes pathways (not shown), sandwiched within the cage-like structure 900'X' as well as conductively separating at least one pair of outer positioned, generally the same sized (there are exceptions to these special outer electrodes), electrically opposing, differential conductive pathways.

With almost all variations of the universal faraday shield architecture with stacked conductive hierarchy progression is utilized as an interconnected shield structure comprising various individually layered shielding electrodes that share a common conductive connection with one another and with an externally located energy pathway not of the differential conductive pathways.

Conductive common connection of the internally placed shielding electrodes with one another and to an external energy pathway not of the differential conductive pathways allows this third pathway to be used simultaneously as a separate energy pathway that can provide a reference voltage to the portions of circuitry contained within an invention embodiment. The third energy pathway utilized by the grouped electrode shielding pathways also simultaneously allows for development of a predetermined low impedance pathway utilized by the respective portions of the energies utilizing the differential pathways for propagation.

Differential propagation of energies through an invention embodiment allows for development of a device or embodiment that provides portions of the energies within an invention embodiment AOC to utilize portions of an invention embodiment in a complementary and balanced manner with respect to one another and to the benefit of the circuit system efficiency over that of similar prior art circuitry. This separate and commonly shared third pathway acts as not only a voltage divider for energies found in predetermined energized circuitry due to its actual physical and electrical placement locations in a normally larger energized circuitry. This physical and electrical location can best be described as a shielding electrode interpositioning and electrically common placement between at least a set of internal, paired and oppositely co-acting, differential conductive energy pathways and at least one pair of outer positioned, generally the same sized (there are exceptions to these special outer electrodes), electrically opposing, differential conductive pathways during energized operations.

The separate third pathway also becomes simultaneously utilized and shared as a common voltage reference node with respect to not only a circuit operating within an invention embodiment and/or its 813 AOC (not shown) but at least a set of paired and oppositely co-acting, differential conductive energy pathways and at least one pair of outer positioned, generally the same sized (there are exceptions to these special outer electrodes), electrically opposing, differential conductive pathways of the same circuit during energized operations, as well.

The invention will also minimize or suppress unwanted energy parasitics originating from either of the paired and oppositely co-acting, differential conductive energy pathways connected to circuitry, respectively, from upsetting one another, portions of the propagating circuit energy or voltage balance within the AOC of an invention embodiment. The invention will also minimize harmful and unwanted energy parasitics a subsequent conduction pathway of release for escaping in the form of common mode energies and the like back into the circuit system to detrimentally affect circuitry outside the AOC influence.

Referring now to FIG. 3, a break down of the overall structure 9905 into even smaller, paired, cage-like conductive structure portions can be done and reveals for example, various smaller grouping of overlapping conductive shield structures down to just 900A which is further comprised of common conductive shielding electrode energy pathways 810F-, 800/800-IM-, 810B- individually of the shield species group will be almost always conductively combined and attached together with external common conductive material 6805 or industry standard connections means (not shown) to allow an externally located common conductive area or pathway 6803 to be utilized and which is not of the various external electrically opposing differential conductive energy pathways that can be found attached to or conductively connected to an invention embodiment for a typical application for the new invention.

As seen in FIG. 3, to condition paired electrically opposing differential conductive bypass propagation mode energy pathways like inner 855BB and inner 855BT and the paired electrically opposing differential conductive bypass propagation mode energy pathways like outer 865BB and outer 865BT of FIG. 3, a larger stacking of containers 800"X" will comprise common conductive universal shielding electrode structure 9905 or equivalent in such a manner that various common conductive pathway shielding electrodes could be added in a predetermined fashion to form the paired 900"X" structures, which in turn form a larger overall shielding electrode structure similar to that shown in FIG. 2.

As long as, common conductive connection material connections 798-GNDA can maintain some type of physical and electrical contact with a portion of common pathways electrode edge 805 by the reach of the generally designated electrode extension portion designated as 79-GND'X', respectively, as shown in FIG.3, a fully configured invention embodiment should work properly.

In FIG. 3, each and every paired electrically opposing differential conductive bypass propagation mode energy pathways like inner 855BB and inner 855BT of FIG. 3 are considered sandwiching the common interconnected conductive pathways each, respectively, such as various combinations of common conductive electrode shielding electrode pathways 810F, 800/800-IM, 810B, which are sandwiching the 855BB and 855BT differential conductive pathways internally and which are themselves also set-back in a generally equal 806 positioning (FIG.1).In addition, each and every paired electrically opposing differential conductive bypass propagation mode energy pathways like outer 865BB and outer 865BT are also stacked yet separated, electrically. Under these conditions the conductive circuit when energized should exploit the invention embodiment functions such as, noise or energy field cancellations or minimizations, filtering and surge suppressions in a complementary and common manner with respect to the internally positioned, common conductive shielding electrode and material areas or deposits, as just discussed. As seen in FIG. 3, each container 800D and 800E can hold an equal number of same sized, differential electrodes such as inner 855BB and inner 855BT that are physically opposing one another to some degree within larger structure 900A, yet they are oriented and will operate in a generally physically and electrically parallel manner, respectively, that allows the various energy conditioning functions to be maintained.

The larger, conductive faraday-cage-like common conductive shield structure 900A with co-acting 800D and 800E individual shield-like structures, become one electrically, at energization when energized within a circuit and attached to the same external common conductive path area 6803 by way of electrode extensions 79-GNDA to externally applied common conductive electrode material for electrical connections that are attached to common conductive area 6803. This is done by conductive solder material 6805 or other normal connection means for conductive attachments or known industry methods like resistive fits, or various soldering methods known methods (not shown) and by utilizing internal electrode extensions 79-GNDA and almost any possible means of commonly acceptable industry attachment methods (not shown) such as reflux solder, conductive epoxies and adhesives and the like (but not shown).

As a result, any manufacturing sequence as follows: (excluding dielectric material, etc.) a differential conductive pathway 865BB, then a common conductive pathway 810B, internally positioned differential conductive pathway 855BB and then central and commonly shared common conductive pathway electrode 800/800-IM, followed by internal differential conductive pathway 855BT, then common conductive pathway 810F and then outer electrically opposing differential conductive pathway 865BT a voltage reference pathway will result when a completed structure for this example is energized in FIG. 3.

Referring more to FIG. 3, portions comprising 810F, 800/800-IM, 810B are now shown comprising part of embodiment 9905 of FIG. 3. Certain common shield electrodes are configured as shielding electrodes comprising two 798-GNDA electrode extensions (shown in detail in FIG. 1) and in turn are combined with the other elements of 9905 embodiment will be almost always placed in combination to form an embodiment with two pairs of paired electrically opposing differential conductive bypass energy pathways comprising two sub-sets of paired energy pathways, inner 855BT and outer 865BT and inner 855BB and outer 865BB respectively and are also considered paired bypass conductive pathway elements sharing a common conductive shielding electrode energy pathway or structure 900A.

FIG. 3 depicts various elements of an attached cut-away version of invention embodiment 9905 and is shown in a cut-away view. The concept of the a universal faraday shield architecture 900A with stacked conductive hierarchy progression comprising separate and circuitry for energies propagating simultaneous along paired and electrically differential pathways that utilize separate operating bypass energy propagation mode is showing structure 9905 comprises stacked, common conductive cage-like structure 900A depicted and which in turn is comprised of multiple, stacked, common conductive cage-like structures or containers 800D and 800E (each referred to generally as 800X), in a generally parallel, but interconnected, conductive shielding electrode relationship. Each common conductive container 800D and 800E comprises at least two common conductive pathway electrodes, 810F, 800/800-IM, 810B. The number of stacked, common conductive interconnected shielding electrode cage-like structures 800x is and is normally of an even integer. Thus the number of stacked, common conductive cage-like structures 900X is also not limited to the number shown herein and is normally of an even or an odd integer.

Also shown, in FIG. 3, is that each paired common conductive cage-like structure 800X sandwiches at least one conductive differential bypass mode pathway electrode that comprise two separately operating pairs of two each, of electrically opposing pairs of same sized conductive differential bypass mode pathway electrodes. The stacked, common conductive interconnected shielding electrode cage-like structures 800X almost all can be used in combination with separate, but paired external differential conductive energy pathways in discrete, or non-discrete configurations such as, but not limited to, a discrete stand-alone component as shown in FIG. 3 and FIG. 7A, or others not shown; such as but not limited to a component combination, discrete and non-discrete embedding within silicone IC's, interposers, modules, substrates or as part of a PCB, energy conditioning networks, and the like.

The common conductive pathway electrodes 810F, 800/800-IM, and 810B are all conductively interconnected as shown at 79-GNDA(s) which provide conductive connection point(s) to external common conductive energy pathway or area 6803 through solder material 6805 or most any other attachment means known within the state of the art. Each common conductive pathway electrode 810F, 800/800-IM, and 810B, is formed on dielectric material 801 and reveal side bands only comprised of dielectric material 801 in place of conductive electrode material 799G.

It should also be noted as shown in FIG. 3 that the paired set electrically opposing differential energy pathways depicted are sets or pairs, co-sized and near completely lapping one another's principal electrode surface areas, although separated by a larger common shielding electrode and 801 dielectric material. They are complementary paired for conductive attachment for electrically opposing operations (when energized). These co-sized, complementary paired electrically differential (in operation) conductive electrode or energy pathways are always physically separated from one another as well as, electrically located on the opposite sides respectively, the electrical charge of one of two principal conductive portions of a common conductive shielding electrode energy pathway with respect to each other. Since all of the electrodes found are generally planar in shape and appearance, aligned respectively per their homogeneous groups, symmetry develops at many levels within the part that is efficiently utilized by the various portions of energies propagating within.

Conductive connection of the joined common conductive and enveloping, multiple common shield electrode pathways 810F, 800/800-IM, and 810B, respectively with a common centrally located common conductive pathway 800/800-IM will almost always become like the extension of external common conductive element or external common conductive energy pathway or area 6803, as shown in FIG. 3 Multiple common shield electrode pathways 810F, 800/800-IM, and 810B will be almost always be interposed in such a multiple parallel manner between and to provide sandwiching of differential electrode conductors inner 855BT and inner 855BB while also themselves being sandwiched by outer positioned, 865BB and 865BT while still maintaining the condition that common shield electrode pathways 810F, 800/800-IM, and 810B will have a minimal of 814C distance separation or 'loop area' with respect to the complimentary, paired and electrically opposing differential electrodes 855BB, 865BB and 855BT and 865BT within dielectric 801.

External conductive element like 798-GNDA, shown in FIG. 3 will aid in performance of the electrostatic shielding functions (not shown) performed by common shield electrode pathways 810F, 800/800-IM, and 810B, among others. The structure also facilitates an energized connection combination as just described that will allow enhancement of the external common conductive energy pathway or area 6803 to aid the interconnected common shielding electrodes within embodiment 9905 to assist in providing efficient, simultaneous conditioning upon portions of energies propagating on or along said portions of assembly 9905s" differential electrode conductors 855BB, 865BB and 855BT and 865BT energy pathways as portions of these conductive pathways within 9905 are externally connected by conductive connection extensions 812A and 812B structures which attach to conductive connection means 890B and 891B for the circuit grouping comprising paired differential electrodes 855BB, 855BT, 865BB and 865BT. The internal and external parallel arrangement groupings of a combined interconnected common shielding electrodes 810F, 800/800-IM, and 810B will also help to cancel or suppress unwanted parasitics and electromagnetic emissions that can escape from or enter upon portions of for the circuit grouping comprising paired differential electrodes inner 855BB and inner 855BT and portions of the circuit grouping comprising paired differential electrodes outer 865BT and outer 865BT through the AOC which are respectively used by portions of energies as they propagate along these disclosed conductive pathways to active assembly load(s) (not shown).

The universal shielding electrode structure will also facilitate availability to portions of propagating circuit energies (not shown) the same type of physical shielding electrode structure 9905 of FIG. 3 that allows for development of a common low impedance energy pathway (not shown) and reference image (not shown) which are not of the differential pathways for portions of the sub-circuit energy pathways to work harmoniously.

In one instant, and simultaneously within the same time, portions of propagating circuit energies will be almost always provided with a energy blocking function of high impedance in one instant for some other opposing and shielded separated portions of energies propagating contained within portions of the AOC with respect to the very same third energy pathway and reference image, while in the very same instant this high impedance-low impedance switching phenomena is occurring in yet a diametrically opposing manner, at the same instant, and occurring for energies propagating relative to the portions of energies located oppositely to one another in a complementary manner, but along opposite sides of the same shared larger universal shielding electrode structure in an electrically harmonious manner.

This would include for example, a plurality of generally planar layers designated as species as shown in FIG. 2 and FIG. 3 for embodiment 9905. These generally planar layers shown in FIG. 3 comprise for example, a ceramic dielectric material 801, with a 799G conductive electrode material applied or deposited during manufacturing. The principal electrode surfaces of the common shielding electrode layers (too numerous to number)are situated generally parallel to the principal dielectric material 801 surfaces (both not shown in FIG. 3) of the embodiment layering 9905.

As shown in FIG. 3, in order to allow for the best possible magnetic field coupling cancellation between the various opposing differential energy pathways within universal faraday shield architecture with stacked conductive hierarchy progression, generally, paired and only a minimal distance from one another should separate operationally opposing differential conductors, as a rule. There can be certain exceptions. However, by operating in a generally opposing or out of phase fashion, mutual coupling of the oppositely positioned pair of energy pathways, 855BB and 865BB, along with 855BT and 865BT enhances mutual cancellation of their respectively opposing magnetic fields while co-acting simultaneously with one another in utilization of the electrostatic or Faraday shielding effects that are also occurring to portions of energies propagating along the various circuitry portions of the same, oppositely positioned pair of energy pathways within an invention embodiment AOC.

It should also be noted that by positioning the two differential conductive pathways as just described with the generally equally spacing of the deposited or applied dielectric medium material, with the predetermined elements of the universal shielding electrode architecture, the resulting invention embodiment structure will yield beneficial energy conditioning to portions of circuit energies located along the differential conductive pathways within the AOC as just described. The paired and opposing differential conductive pathways as just described, also maintain an energized relationship that is electrically complementary in some ways yet also simultaneously electrically opposite to one another, regardless of the generalized direction of portions of the propagating energies residing along each of the respectively paired differential energy pathways 855BB and 865BB, along with 855BT and 865BT.

Such a configuration as shown in FIG. 3 comprising for example 855BB and 865BB, along with 855BT and 865BT, respectively will yield one of the two respective differential energy pathways each, 855BT and 865BT electrically located as energy pathways that are in this case, electrically located between a energy source and a energy-utilizing load separated by the 800-IM central common conductive shield element and others, while the remaining respective differential energy pathways, 855BB and 865BB will also be considered electrically located as energy pathways positioned between an energy-utilizing load that is connecting back to it's energy source originator that initiated portions in some form or another of the portions of energies propagating along with a defined circuitry that could be considered from the source of the energy propagations that began at the initial time of circuit energization. That is, one of two respective, adjacent but shielded and separated differential energy pathways or differential electrodes 855B and 865BB for example exist in an energized state in a mutually co-active relationship to one another but between the shielded architecture both physically and electrically yet the actual physical separations maintained are in a range anywhere from between less than 50 mms to a smaller number that is still larger than 0 mms or greater, as long each handles propagation of portions of circuit energies with respect to the other.

Conductive connection of the joined common conductive and enveloping, multiple common shield pathways, respectively with a common centrally located common conductive pathway 800'X'-IM will almost always become like the extension of external conductive element 6803, as shown in FIG. 3, for example, and will almost always be interposed in such a multiple parallel manner that said common conductive elements will almost always have microns of distance separation or 'loop area' with respect to the complimentary, phased differential electrodes that are sandwiched themselves and yet are separated from the extension of external common conductive energy pathway or area 6803, shown in FIG. 3, for example by a distance comprising a dielectric medium.

This enables the electrical or conductive extension of external common conductive energy pathway or area 6803 shown in FIG. 3 to aid in performance of the electrostatic shielding functions, among others, that the energized combination as just described will almost always enhance and produce efficient, simultaneous conditioning upon the energy propagating on or along said portions of shielding electrode assembly 900A's outer differential conductors 865BB and 865BT. The internal and external parallel arrangement groupings of a combined common conductive 900A will almost always also cancel or suppress unwanted parasitics and electromagnetic emissions that can escape from or enter upon portions of said differential conductors differential conductors 855BT and 855BB used by said portions of energy as it propagates along a conductive pathways (not shown) to active assembly load(s) not shown in FIG. 3.

Thus, almost all embodiments and variations of an invention embodiment similarly constructed or manufactured by standard means and used with standard, single, paired line circuit situations and having a dielectric difference as the only significant variation between identically configured invention embodiments will almost always yield an insertion loss performance measurement in a manner that is unexpected and unobvious considering the respectively know dielectric material response of prior art. This comparison of like similar type invention units (other than of dielectric material) clearly and unequivocally reveals the primarily reason or factor causing this result and circuit performances is balance of elements within the embodiments, the larger common conductive shield structure and the conductive attachment of a common external conductive element that is working in combination using electrostatic suppression, physical shielding for influencing the conditioning of energy propagated within a circuit system that the various invention embodiments are incorporated into. Users of the various invention embodiments may use all most any type of the industry standard means of attachment methodologies and/or conductive materials or structures to conductively connect all common conductive energy pathways to one another and/or to the same externally located conductive energy pathway that is normally separate of the differential paired pathways.

The critical nature of the full balanced attachment of all exiting common conductive electrode pathways located or accessible to an external conductive energy pathway attachment has been revealed in past disclosures as very critical in achieving a simultaneous ability to perform multiple and distinct energy conditioning functions such as power and signal decoupling, filtering, voltage balancing using electrical positioning relative to opposite sides of a "0" Voltage reference created on opposite sides of the single centrally positioned common and shared conductive electrode pathway and the principals as disclosed in those documents carries forward with the invention embodiments The invention attachment to a same common conductive external area or pathway of all common and conductively attached common electrode elements will almost always allow AOC propagated energy to operate electrically parallel with respect to the source(s) and the load(s) as well as operate electrically in parallel with the other common conductive structures positioned not only to each other but also with respect to almost any main circuit when connected to a separate return path, inherent ground, chassis ground or low impedance pathway not of the differential conductive pathways. With the USS placed and attached as described in an energized circuit, common conductive energy pathways in parallel to the internal and external differential energy pathways, as disclosed will almost always thereby again enhance and lower the impedance of the third conductive/common conductive pathway within the AOC to allow propagated energy-return path that can be utilized portions of energy originating from a source.

It should be noted that although normally both the external and internal differential electrode energy pathways are balanced once an invention is placed upon the common conductive area. The addition of the outer positioned common conductive paths adds back the conductive energy pathway balance and shifts the self-resonate point out in similar-type-invention testing. It is disclosed as shown in FIG. 2 and FIG. 3 that additionally placed, common conductive energy pathways those marked (#IM) attached with the inherent central, shared image "0" voltage reference plane will almost always increase the shielding effectiveness of an invention embodiment in many ways. These are additionally placed common conductive energy pathways located outside and sandwiching in close proximity to its adjacent internally positioned neighbor is for a purpose larger than that of adding capacitance to the USS embodiments. These additionally placed common conductive energy pathways are placed before any final application of at least one set of outer differential electrode pair(s)

Thus, hysteresis effect is significantly reduced closer to zero within an invention embodiment due to the complementary stress forces placed upon the materials arriving in a manner that is almost 180 degrees—opposing or out of phase simultaneously on the other side of the interposed common electrode energy pathways—. These stress handling techniques as disclosed are very difficult to duplicate with prior art componentry, if at all. This is particularly true for prior art componentry configured in feedthru propagation modes and applications. 79S"X" used for designation of the conductive electrode extension portions allows flow of portions of propagating energy along the internally positioned differential conductive electrodes that are arriving from external conductive connection structures (not fully shown) that are attached by standard industry means and methodologies.

Figure 7B:
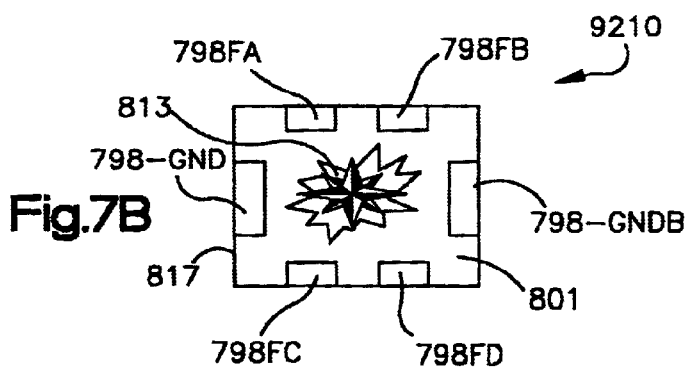
FIG. 7B shows portion of a top view of 9910 in accordance with the present invention.

A new invention embodiment like 9210 shown in FIG. 7A and FIG. 7B can be comprised of a SPLIT electrode 7300C and 7300D straight feedthru version which are positioned or spaced closely relative to one another in such a manner that each set of SPLIT-differential electrode planes of conductive electrode materials 799 normally appear to be comprise—singular—in a completed 9210, with the same or slightly less in volumetric size then that of a prior art structure.

Yet this small, but significant configuration of SPLIT-differential electrodes for either a homogeneous electrode group, alone (differential electrodes only or just the common electrodes only) or even both groups (differential and common electrodes) within the new invention configurations like 9210 of FIG. 7A or the like would allow for more energy carrying or energy propagation ability utilizing each set of SPLIT-differential electrode planes of conductive electrode materials 799 and less layerings of what would be needed for any single common or differential electrode used by occupying less area, allowing for more circuitry conductive connections while simultaneously handling additional energy-conditioning demands of a plurality of regular electrode energy pathways with more efficient and larger energy handling capacity than that found in an identically sized prior art device containing more distinct numbers of same sized SPLIT differential feedthru conductive differential electrodes or common shielding electrodes as well.

Figure 5:
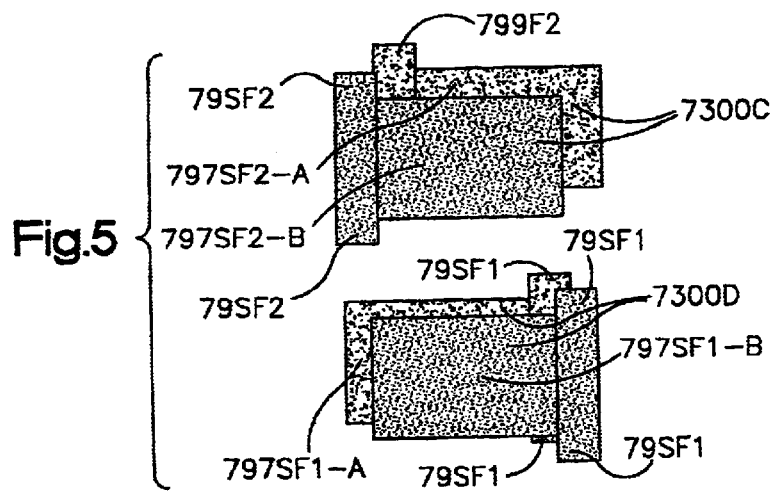
FIG. 5 shows portion of a plan view of a paired set of 'straight feedthru' feedthru electrode layering comprising electrode energy pathways configured with a split-differential electrode configuration in accordance with the present invention.

The prior art devices utilizing these closely positioned pairs of SPLIT-electrodes 7300C and 7300D like shown in FIG. 5 for energy conditioning, will still not be as effective or energy efficient as—the new invention.

For example, when just configuring for Split differential electrodes, only, just because of the combining of the various groups of electrodes, split or not into a predetermined positioning architecture, one results in a device or embodiment that utilizes fewer SPLIT-layerings of the total electrodes in a similarly layered and aligned, prior art stack-up.

In a differential, three pathway circuit attachment scheme, for instance, a prior art device would effectively have doubled the number of current carrying electrodes for increasing its energy handling ability, the new invention with less of the same number of SPLIT-electrode pathways will be able to handle more energy than that of the prior art due to the predetermined arraignment of both SPLIT and non-SPLIT common and differential, conductive electrode energy-carrying pathways.

Thus 7300C and 7300D that SPLIT, differential electrodes 7300C and 7300D together, are defined as at least two single same-sized, energy pathways separated by at least a larger third common conductive shielding electrode or internal energy pathway that is placed in an interposed positioned to be shared by both 7300C and 7300D for energy conditioning still utilize the same voltage reference for circuit reference functions in embodiment 9210 as an un-split pairing would use. They still comprise one set of electrically opposed and paired, same-sized conductive electrode principal areas 797"x" for each set of placed electrode material 799 and planar areas for part of many variations of energy conditioning embodiments utilizing a common voltage reference for the circuit reference functions. This is universal in the invention with split electrode configurations. These two co-sized sized conductive material or electrode energy pathway areas 7300C and 7300D are still smaller than the common shielding electrodes 810F-1&2, 800/800-IM-1 & 2, 810B-1&2 that all together comprise a grouping of four distinct, yet closely spaced pairs of two units each of thin conductive electrode elements 797SF1-A, 797SF1-B and 797SF2-A, 797SF2-B, respectively separated in substantially parallel relation in and among themselves by a thin layer of the dielectric casing material 801.

Looking at FIG. 7A, it should be noted that similarly, each common, shielding electrode energy pathways does not have to comprise of a corresponding closely spaced pair of thin common, shielding electrode energy pathway elements because it is not necessary for these common shielding electrode structure elements for these shielding electrodes to possess double the total electrode surface area because of using this configuration in all cases, the common shielding electrode structure elements that comprise the larger universal common conductive shielding electrode structure architecture with stacked hierarchy progression does not handle energy the main input or output energy propagation pathway functions like those of the prior art. Rather, the common shielding electrode structure elements are utilized within an invention embodiment 9210 and the like, in most cases, as a third, additional energy transmission pathway not of the external differential energy pathways (not shown).

Referring now to FIG. 7B, the 9210 stacking shown in FIG. 7A, is now shown as a finished energy-conditioning component. Six external conductive connecting electrodes designated 798-"X", and each specifically designated by their respective external conductive connection structures or electrodes, surround the 9210 body. The energy-conditioning component 9210 comprises two external common conductive connecting electrodes 798-GNDA AND 798-GNDB for common conductive connections of all internally located GNDG shield electrodes to an external, common conductive energy pathway (not shown) not of any of the differential external energy pathways or circuitry (not shown). Four crossover feedthru external conductive connecting electrodes 798FA and 798F-D and 798FC, and 798FB for conductive connection external differential conductive circuit pathways (not shown), and two external common conductive connecting electrodes 798-GNDA and 798-GNDB for conductive connection to a third external differential conductive circuit pathway (not shown).

To improve further and simplify elements as referenced in the disclosure, invention as shown in FIG. 7A discloses a single circuit, high-low voltage handling ability provided within the same energy-conditioning embodiment to allow both a low voltage energy conditioning function utilized for a predetermined energized circuit but to simultaneously function for a circuit utilizing a high-voltage energy pathway and conditioning function within the very same multi-layer invention if desired, is now disclosed.

Thus, some of FIG. 7A's other embodiments overall (not shown), are suitable for simultaneous electrical circuit systems comprising both low and high-voltage circuit applications that will almost always provide excellent reliability by utilizing a balanced shielding electrode architecture incorporating paired, and smaller-sized (relative to the common shielding pathway electrodes) electrodes, but also same-sized and paired differential straight feed-thru configured and paired differential feedthru configured conductive and electrically opposing electrodes as shown in FIG. 5, for example.

The spacing 814B between the split conductive electrode element pairs 797F4A, 797F4B and 797F3A, 797F3B, as well as, 797F1A, 797F1B and 797F2A, 797F2B, is desirably minimized, to be typically less than 1.0 mil, but greater than 0, dependent upon currently existing manufacturing tolerances and electrode material energy-handling properties will almost always allow for the desired effect, whereas the dielectric distance 814C that can be found between the interpositioned differential and common energy pathway electrodes 797F1B and 810B-1 & 2, and 797F2A and 810B-1 & 2 for example, is substantially greater than that of the 814-B separation.

It should be noted that each paired and SPLIT conductive electrode pathway is essentially very similar in conductive area size, but preferably the same with respect to its SPLIT mate, and thus the twin plates designated 797F4A, 797F4B and 797F1A, 797F1B, respectively are each merely reversed conductive electrode material mirror images of 797F3A, 797F3B and 797F2A, 797F2B. However, the electrically opposing differential electrode pairs of 797F3A, 797F3B and 797F2A, 797F2B, respectively will almost always be considered reversed mirror images of 797F4A, 797F4B and 797F1A, 797F1B as a whole, each almost always relative to its position within the embodiment 9210.

An actual embodiment 9210 manufacturing sequence for building one of these specific energy conductive pathway structures will now be outlined and described in a discrete variation of FIG. 7A. At first, a deposit or placement of dielectric material 801 is made, then placement and positioning of a layering of electrode material 799G to allow formation of differential conductive pathway 797F2B, then, a very thin layer 814B spaced, dielectric material 801 is made, followed by a layering of 799 electrode material for the formation of differential conductive pathway 797F2A, then an 814C application of dielectric material 801 is placed, then followed by the placement positioning of a layering of electrode material 799G for formation of common conductive shielding electrode pathway 810B-1 & 2, then a 814C layering of dielectric material 801, followed by a layering of electrode material 799 for formation of differential conductive pathway 797F1B, a very thin layer 814B spaced in distance of dielectric material 801 is utilized, then a another layering of electrode material 799 for formation of differential conductive pathway 797F1A, then a 814C layering of dielectric material 801, then a layering of electrode material 799G for formation of common conductive shielding electrode pathway 800/800-IM-1 & 2 which is also the shared, central shielding electrode structure balance point and central common pathway point of the universal conductive cage-like structure for embodiment 9210, then a 814C layering of dielectric material 801, then a layering of 799 electrode material to allow formation of differential crossover feed-thru electrode pathway 797F3B, followed by a 814B deposit of dielectric material 801, then a layering of 799 electrode material to allow formation of differential cross-over feed-thru electrode pathway 797F3A, followed by a 814C deposit of dielectric material 801 then a layering of electrode material 799G for formation of common conductive shielding electrode pathway 810F-1 & 2, a 814C dielectric material 801, then a layering of 799 electrode material to allow formation of differential crossover feed-thru electrode pathway 797F4B, followed by a 814B deposit of dielectric material 801, then a layering of 799 electrode material to allow formation of differential cross-over feed-thru electrode pathway 797F4A; then and finally an 814 application of dielectric material 801 to comprise some of the major fundamental layering structure and supporting elements the physical stacking composition of 9210.

While the SPLIT electrode 7300C and 7300D construction can approximately double the current carrying ability over that of one single paired energy pathway grouping, this differential electrode feature will almost always also allow the voltage dividing function of almost any of the invention embodiments like 9210 as shown in FIG. 7A with cross-over type differential conductive electrodes to further take advantage of an invention embodiments' circuit voltage dividing architecture to increase the invention embodiments' own overall current handling ability with an increased reduction in size and while still maintaining a relatively less stressful energy conditioning environment for the various 799 electrode material elements that comprise the various 799 electrode material elements of an invention embodiment.

Thus, new invention is also suitable for simultaneous electrical systems comprising both low and high-voltage circuit applications that will almost always provide excellent reliability by utilizing a balanced shielding electrode architecture incorporating paired, and smaller-sized (relative to the common shielding pathway electrodes) differential pathway electrodes. In addition, an invention embodiment can also be combined with, and suitable for electrical systems comprising various low and high current circuit applications. It should also be noted that various heterogeneous combinations of either both or mixed same-sized and paired differential bypass and paired differential feed-thru energy pathways that are configured for electrically opposing, paired operations can be stacked vertically or horizontally or in a combination of both vertically and horizontally mixed and matched differential circuitry pathways using a variety of energy propagation modes as described.

Thus, almost all embodiments and variations of an invention embodiment similarly constructed or manufactured by standard means and used with standard, paired line circuit situations and having a dielectric difference as the only significant variation between alike configured invention embodiments will almost always yield an insertion loss performance measurement in a manner that was, until now, unexpected and unobvious considering the respectively known dielectric material response of prior art.

This comparison of—similar type invention units (other than of dielectric material) this clearly and unequivocally reveals a large reason or factor causing this result and circuit performances is the new common conductive shield structure and external conductive attachment elements working in combination using electrostatic shielding for parasitic suppressions, physical shielding and for influencing the conditioning of energy propagated within the circuit system said invention is incorporated into. Thus, discrete, non-discreet embodiments using a common conductive shield structure and external conductive attachment elements as disclosed and using dielectrics that have been categorized primarily for a certain electrical conditioning function or results, will almost always find that usage with invention embodiment elements constructed with element equivalents will almost always achieve unexpected and beneficial characteristics added to the previously limited usage knowledge of the dielectric material used. This includes almost any possible layered application that uses non-discreet capacitive or inductive structures that can incorporate a variation of an invention embodiment within a manufactured discrete silicon die and the like, for example, or a super capacitor application or even an atomic level energy conditioning structure.

Turning back to FIG. 7A, dielectric material 801's spacings or the spacing equivalent (not fully shown) separation distances designated as 806A, 806, 814, 814A, 814B, 814C and 814D (not fully shown) are almost always device-relevant. By looking at the cross section provided in FIG. 7A, an observer will note the other significant vertical and horizontal distance separation relationships (not fully shown) that are of a predetermined electrode and conductive pathway stacking arrangement (not fully shown) that is depicted.

It is noted that almost all the separation distances of elements within the 9210 device for example, are relative to the various electrode pathway structures contained within the device and though, not absolutely necessary for many circuit energy-conditioning applications, in order to maintain control of the balance within a specific, system circuit, these material distance relationships should be even in embodiment spacing considerations and distributions. Large variances or inconsistencies with these paired volumes or distances of materials have been experimented with and are detrimental for circuit balance for most general electrical applications of the present invention.

In FIG. 7A for example, the various separation distances 814"X" call out an application-relative, predetermined, 3-demensional distance or area of spacing or separation filled with 801 material as measured between common shielding electrode energy path-containers, 800D and 800E, respectively, and the various differential electrodes, split, other otherwise.

Separation distance 814A(not shown) is a generally very small parallel adjacent area of three dimensional separation distance or proximity of spacing found between multiple adjacent common electrode material pathways such as common electrode pathway—and common electrode pathway image shield 800/800-IM—for example containing a thin dielectric material 801 or spacing equivalent (not fully shown) or other type of spacer (not shown).

Separation distance 814C is the vertical separation found between common electrode pathways such as common electrode pathway and differential electrode pathways such as differential electrode pathways. Separation distance 814B is the vertical separation between SPLIT differential conductive pathways such as SPLIT differential conductive pathways 797F1A and 797F1-B and 797F2-A and 797F2-B.

These unique combinations of dynamic and static forces (not shown) occur simultaneously within the containment of shielding electrode structure and due to its use as a conduit, to a third energy pathway distinct from the differential pathways. Thus by utilizing and combining various rules of physical element distance and energy field separations between conductive energy pathways, dielectric materials, nonconductive materials, as well as the dynamic energy relationships that are taking place within an energized circuit pathway found within a energy-conditioning ability is provided.

Internally, unbalanced circuits within prior art energy conditioners that are not operating with opposing differential environments will almost always normally produce wide degrees of hysteresis effect, material memory effect, angular stresses, uneven expansion due to thermal stressing various materials, each having a different coefficient of thermal expansion and like, and are all reduced in terms of their effective voltage dividing ability from that taking place within a mutually opposing complementary energy propagation that is taking place within the invention embodiment, in contrast.

Figure 4:
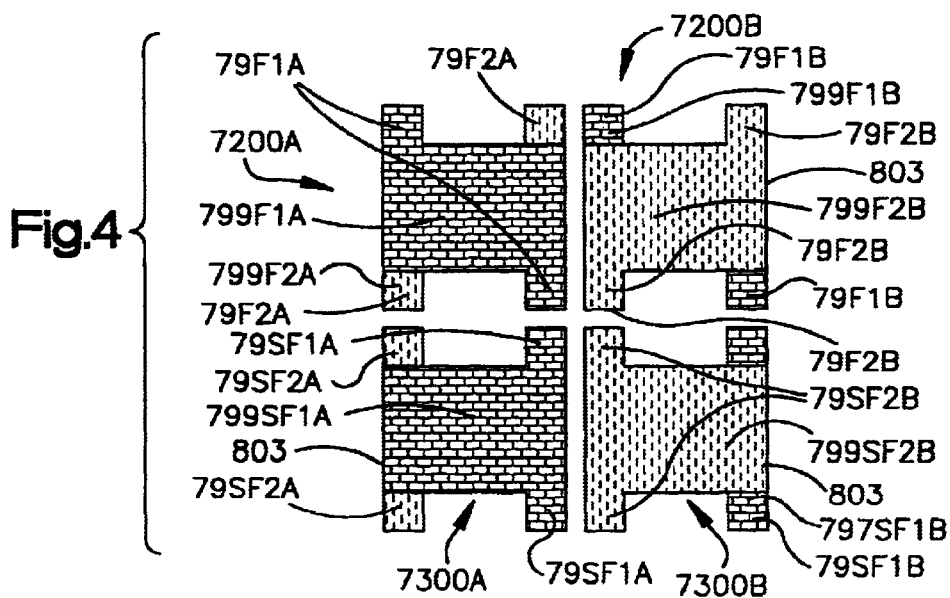
FIG. 4 shows portion of a top plan view of layering positioning for two sets of differential, twisted pair, crossover feedthru electrode energy pathways in accordance with the present invention.

Looking now at FIG. 4 thru FIG. 5, one sees a variety of different configurations of pairs of dielectric/electrode layers or just electrode layers alone are shown. For FIG. 4 and FIG. 5, each of these pairs of electrodes or electrode layers are shown having at least two portions of differential electrode pathway material and dielectric material 801(not shown).

The difference between some of these structures is best represented in FIG. 4, which shows a top view of two side-by-side, top-on-top stackings 7200A and 7200B of two different feedthru differential electrode pathways 799F1A, 799F2A and 799F1B, 799F2B. The configuration generally designated as 7200A and 7200B are generally referred to as crossover feedthru differential electrode pathways 799F1A, 799F2A and 799F1B, 799F2B. in that the energy propagating through each pathway must "crossover" the energy propagating through the other, but interposed between this action is a common shielding electrode pathway of the third energy pathway (not shown) not of these electrically opposing crossover feedthru differential electrode pathways 799F1A, 799F2A and 799F1B, 799F2B, all within the invention 813 AOC (not shown) so to enable the total invention (not shown) so to provide and utilize a portion of energy conditioning from this positioning and energy flowing effect.

The relative spacing separation dimensions 814-"X" (FIG. 7A) of the pair's crossover portion or section and the quick twisting of energy propagations (not shown) has a positive effect on the lowering or minimization of a circuit portion impedance within an 813 AOC (FIG.7A) and is a uniform impedance result due to the concentration effect of propagating energies along the crossover feedthru differential electrode pathways (not shown) 799F1A, 799F2A and 799F1B, 799F2B pair's influence upon one another such that the individual twisting effect occurring in either opposing or same directional propagations enhances the pairs interactions in a manner with respect to a cancellation effect as compared to the straight feed-thru pair propagational method. Twisted or cross-over electrically opposing differential electrode pathway pairing exploits the very short distance (as defined by industry capabilities)(not shown) of conductive electrode separation effect upon opposing electrical electrode conductors such as the paired crossover feedthru differential electrode pathways 799F1A, 799F2A and 799F1B, 799F2B and allows them to take full advantage of this beneficial electrical conditioning effect for each circuit (not shown) utilizing this techniques within almost any of the new invention's embodiment variations The two side by side stacking configurations generally designated as 7300A and 7300B are generally comprising what is referred to as electrically opposing straight feedthru differential electrode pathways and are represented by 799SF1A, 799SF2A (not shown but below 799SF1A) and 799SF2B, 799SF1B (not shown but below 799SF2B) herein, in that the electrically opposing straight feedthru differential electrode pathways have entry/exit points for portions of energies respectively which are located in line with each other and are added by 79SF1A, 79SF2A and 79SF2B, 79SF1B conductive electrode extension pairs of just described. The energy propagating through each differential electrode pathway 799SF1A, 799SF2A and 799SF1B, 799SF2B enters the larger area of differential electrode pathways 799SF1A, 799SF2A and 799SF1B, 799SF2B such that the portions of energy propagating in opposite directions through the differential electrode pathways 799SF1A, 799SF2A and 799SF1B, 799SF2B provides various simultaneous energy conditioning effects upon the portions of propagating energy within the AOC.

In the past, passive components containing a layered architecture have been produced by formulating the dielectric material into relatively thin sheets. While in a relatively flexible or "green" state before firing, the dielectric sheets are electrode or silk-screened with a refractory or conductive metal or metal deposits to define thin conductive electrodes of selected area. A plurality of these dielectric based sheets with conductive electrodes thereon are laminated into a stack and then fired to form the sheets into a rigid and dense, substantially monolithic casing structure having the differential and common conductive electrodes embedded therein at a predetermined dielectric spacing with the predetermined layering sequence of differential, common conductive electrodes accomplished. In feed-thru operations with current passing through the common plate electrodes, the inherent resistance provided by the thin electrode plates results in at least some power loss in the form of heat, although it can be considered minimal in a by-pass configuration such as with the current invention with the common conductive plates shorting to a external conductive area or other type of attachment. The electrode plate power loss, and thus the magnitude of plate heating in feed-thru-like operation, is a function of electrical energy. If the plate energy is sufficiently high for even a relatively short period, sufficient plate heating can occur to cause electrode/plate failure, particularly by localized disruption of the thin electrode plates and/or the connections thereof to the conductive termination components. Prior art filter capacitors used in pacemaker and defibrillator applications regularly encounter relatively high pulse in-rush currents, and are thus susceptible to overheating and related failures and are a good example of this problem. One approach to resolving this problem involves increasing the thickness of the electrode plate layers within the multi layered electronic circuit conditioning assemblies' layered structure. However, a significant increase in layer thickness is not desirable or practical using existing electrode plating and silk-screening technologies. Excessively thick electrode layers or plates lead to layer delaminating and related reliability problems. In this regard, it is important for the electrode plates to have a thin and discontinuous structure with chosen dielectric grain growth penetrating through and integrating the entire structure into a rugged monolithic structure. Another approach is to increase the total surface area of the conductive electrode plates, but this concept has required a significant increase in the volumetric size of the physical size of the structure in a manner that is incompatible with many circuit applications.

One manner of fabrication of the by-pass or feedthru device for an embodiment similar to a multi-layered, industry-sized unit is identical to the conventional methods of fabricating multi-layered ceramic capacitors. Since this methodology is well known to those skilled in the art, it will be merely briefly described. The dielectric components are formed by casting a thin layer of a slurry of finely divided dielectric forming material such as barium titanate suspended in a liquid matrix including binder. The "green" ceramic is screen printed with electrode forming ink in the desired shaped patterns. Typically, the ink will include a metal, such as palladium. Patterned green ceramics are superposed to provide the desired number of layers, the patterns of adjacent layers being coordinated to achieve the desired overlapped condition. Individual units are diced from the superposed layers in such manner as to expose base portions at opposite ends of the pre-fired chips. The diced units are thereafter subjected to binder burn-off at a first temperature and thereafter sintered at a higher temperature to define the monolith. Terminations are applied to the respective exposed base portions at one end and another at the other end. Terminations may be formed in any of a number of known manners including vapor deposition to provide electrical and mechanical bond to the exposed electrode bases at opposite ends of the monolith followed by application of one or more metallic layers over the sputtered layer to enable soldering to the motherboard. The terminations may extend beyond the end margins where surface mounting is desired.

Alternative termination methods include applications of carbon followed by an outer silver layer with or without intervening metallic layers between carbon and silver. Layers of material elements are also compatible with available and future processing technology. The present invention overcomes the problems and disadvantages encountered in the prior art by providing an improved circuit conditioning function with an embedded electrode layer/plate pattern that is capable of handling significantly higher RF propagational portions in certain predetermined applications, without requiring a significant increase in the volumetric size.

Ideally, common conductive electrode layers share multiple points or conductive pathways of common connection to one another and to the same externally conductive area or external common conductive path as energy is conducting or affecting said common elements in a parallel manner. The energized invention as a whole, made up of the layered elements posses a multitude of complementary dynamic energy paths of varying intensity or degrees and these complementary dynamic energy paths can be considered three-dimensional and multi-directional in terms of a simultaneous energy transmission direction.

Energy movement through the invention as a whole is different with respect to the energy transmission path or movement path for a single, layered element of the invention, yet both types of movement or influences are occurring complementary, dynamic as well as simultaneously through both non-parallel and parallel energy transmission paths. Since these energy transfer movements, parallel and non-parallel, are occurring simultaneously within the invention, they have an effect on the circuit functions and effectiveness. These movements are always dynamic and influencing some or all of the layered elements, simultaneously.

For example, when used as a capacitive energy conditioner and placed in a differential application and attached to three separate energy pathways or in a circuit with the common electrode pathways attached to an independent common conductive pathway, the current load carried by each energy conditioner electrode layer or layering is a function of the number of layers used in a capacitive energy conditioner.

That is, using twice the number electrode layers halves the current carried by each layer in a given circuit application. Thus, by doubling the number of electrode layers, the power, which must be dissipated by each layer in the form of heat, is reduced by a factor of four.

Accordingly, based on power dissipation alone, a capacitive energy conditioner with twice the number of electrode layers has a significantly greater current handling capacity without heat-caused damage. In the past, however, doubling the number of capacitive energy conditioner layers has essentially required a corresponding increase in capacitive energy conditioner size, wherein the requisite size increase is not compatible with certain operating environments.

The present invention resides in the recognition that the number of electrode layers in a capacitive energy conditioner can be effectively doubled to provide significantly improved current handling capacity, but in high voltage applications where the required dielectric spacing is relatively thick, there is only a small increase in the physical size of a capacitive energy conditioner using the split-layer technology for the common conductive electrodes only. This is also true when the physical size of a capacitive energy conditioner using the split-layer technology for the differential conductive electrodes is only used. This is also true when the physical size of a capacitive energy conditioner using the split-layer technology for both, the differential conductive electrodes and for the common conductive electrodes is used together.

Figure 6A:
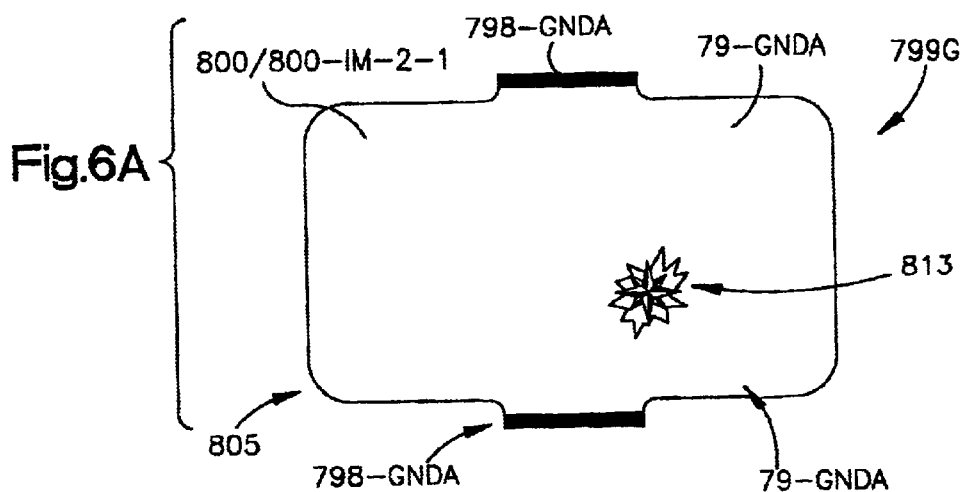
Figure 6B:
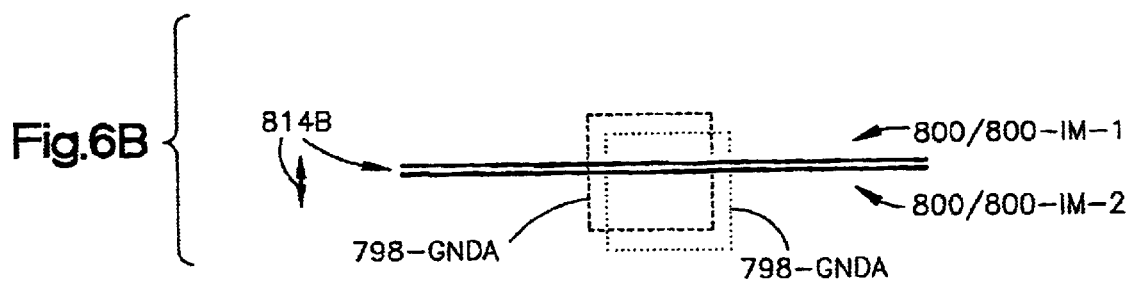
FIG. 6B shows a detailed plan view cross-section depicting a typical spilt electrode configuration in accordance with the present invention.

Turning to FIG. 6, electrode 800/800-IM of FIG. 1 is taken as a common closely paired, symmetrical electrode assembly or split-pairing of equal-sized elements 800/800-IM-1 and 800/800-IM-2 electrode halves and separated by a very thin layer 814B of a dielectric material 801, in this instance, 800/800-IM into the dual layer elements 800/800-IM-1 and 800/800-IM-2 as described above. This is achieved by subdividing the 800/800-IM electrode layering for example or whether it be differential electrode (not shown), into closely paired, symmetrical electrodes and equal-sized elements separated by a very thin 814B spacing layer of a dielectric material 801, which could be different than material 801 depending on properties of the 814B thin layering that are desired to preserve the capability of the not only the electrode element as a whole itself, but to the entire energy conditioner in its ability and reliability withstand in and out rush of energies from electrified or energized operations including anomalies such as voltage pulses and surge. The distance between slit-electrodes is normally greater than zero to a range of 25% of the separation distance either planned for or normally found between any two non-split electrodes or the normally found as electrode spacing between any two split-pairings of a differential and a common electrode grouping that are separated from one another by a material like 801.

With this construction, each active layer element 800/800-IM-1 & 2 as a whole is disposed in the desired and normal dielectric spaced relation with a corresponding differential electrode (not shown).

The only increase in total energy conditioner size for a given number of common electrode layers like 800/800-IM-1 & 2 or 800"X"-1 & 2 involves the minimal thickness spacing 814B of the specific dielectric material like an 801 or even another that is used in conjunction between each pair of dual layer elements 800/800-IM-1 & 2.

Referring now to various elements shown in FIG. 5. U.S. Pat. No. 5,978,204 discloses 'a layered capacitor architecture that comprises a plurality of active and ground electrode plates interleaved and embedded within a dielectric casing of ceramic and the like with each active and ground plate being defined by a closely spaced pair of conductive plate elements which significantly increase the total area of each electrode plate, and thereby correspondingly increase the current handling capacity of the prior art capacitor.

Before further explanation on how to improve further and simplify certain elements as referenced in the 204' disclosure, a portion of a new invention embodiment like as shown in FIG. 5 will now disclose a high-low voltage handling ability that can include and separately distinct circuits energized with each respective embodiment not shown or like shown in 9210 for FIG. 7A which are provide as a varied, but foundational shielding electrode energy-conditioning embodiment or structure, that can allow both a low-voltage energy conditioning function to be utilized for a predetermined energized circuit but to also simultaneously function for a circuit utilizing a high-voltage energy pathway and conditioning function within the very same multi-layer invention, if desired.

FIG. 5 shows electrically opposing differential electrode pairings, 7300C and 7300D. Each full differential electrode 7300C and 7300D comprises SPLIT electrodes 797SF1-A and 797SF1-B and 797SF2-A and 797SF2-B, respectively, which form 7300C and 7300D which are grouped and paired but electrically straight feedthru differential electrode energy pathways and are similar in construction to the electrically opposing differential electrode pairings comprising part of embodiment 9210 of FIG. 7A. Each SPLIT differential electrodes of parent 797SF2 and 797SF1 are positioned in such close proximity within an invention embodiment that the pair of SPLIT differential electrodes 797SF1-A and 797SF1-B and 797SF2-A and 797SF2-B, respectively, work as one single capacitor plate 7300C and 7300D each, respectively when they are electrically defined. 79-SF1 AND 79-SF2 of FIG. 5 are simply elongated portions of the electrode shape constructed and used for designation of the conductive electrode extension portions allowing the flow of portions of propagating energies along the internally positioned differential conductive electrodes that are arriving from external conductive connection structures (not shown) that are attached by standard industry means and methodologies.

These dual plate elements 797SF1-A and 797SF1-B and 797SF2-A and 797SF2-B, respectively, cooperatively to define electrically opposing paired set of two differential conductive pathway electrode parents 7300C and 7300D electrode elements of significantly increased total electrode skin surface area that will almost always react to a corresponding increase of current handling capacity of a energized circuit one without significantly increasing the total volumetric size of an overall energy-conditioning structure (not shown).

To go further and define the improvement over the current state of prior art an invention embodiment (not shown) allows the use of these SPLIT differential electrode pairs, 797SF1-A and 797SF1-B and 797SF2-A and 797SF2-B which are placed in a position of separation 814B by only microns with respect to one another and as such, will almost always allow portions of propagating energies traveling along these differential conductive pathways to utilize the closely positioned SPLIT pairings 797SF1-A and 797SF1-B and 797SF2-A and 797SF2-B in such manner that it will almost always appear within a circuit (not shown) that each grouping of SPLIT electrodes as described is as one single differential conductive electrode each and yet this can be done without having to configure additional common conductive shielding electrodes as well. The advantage of using paired SPLIT electrodes is that the additional area gained by using the additional electrode will almost always significantly increase the current handling ability of the two electrically opposing, differential conductive pathway 797SF1-A and 797SF1-B and 797SF2-A and 797SF2-B electrode elements with respective to the current carrying ability of one un-spilt paired group of differential, electrically opposing energy pathways 7300E and 7300E (not shown) without this feature.

While the SPLIT electrode 7300C and 7300D construction can approximately double the current carrying ability over that of one single paired energy pathway grouping, this differential electrode feature will almost always also allow the voltage dividing function of almost any of the invention embodiments like 9210 as shown in FIG. 7A with cross-over type differential conductive electrodes to further take advantage of an invention embodiments' circuit voltage dividing architecture to increase the invention embodiments' own overall current handling ability with an increased reduction in same size and while still maintaining a relatively less stressful energy conditioning environment for the various 799 electrode material elements that comprise the various 799 electrode material elements of an invention embodiment.

Turning back to FIG. 7A, dielectric material 801 spacings or the spacing equivalent (not fully shown) separation distances designated 806A, 806, 814, 814A, 814B, 814C and 814D (not fully shown) are almost always device-relevant. By looking at the cross section provided in FIG. 7A, an observer will note the other significant vertical distance and vertical separation relationships (not fully shown) that are of a predetermined electrode and conductive pathway stacking arrangement (not fully shown) that is depicted.

It is noted that almost all the separation distances of elements within the 9210 device for example, are relative to the various electrode pathway structures contained within the device and though, not absolutely necessary for many energy-conditioning applications, in order to maintain control of the balance within a specific, system circuit, these material distance relationships should be even in embodiment spacing considerations and distributions. Large variances or inconsistencies with these paired volumes or distances of materials have been experimented with and are detrimental for circuit balance for most general electrical applications of the present invention. The utility and versatility of the shielding structure with split electrodes can be imagined for in FIG. 2, for example. In FIG. 2, the separation distances 814 called out in FIG. 3 could be used in an application-relative, needing predetermined, 3-demensional distance or area of spacing or separation as measured between common shielding electrode energy path-container 800C, 800D, 800E, 800F respectively. FIG. 2 could also contain a single or grouping of SPLIT differential electrodes, such as 800F comprising common shields 810B-1&2 and 820B1&2 and containing differential conductive pathway 797SF2 like it shown in FIG. 7A, including areas abutting or bordering along conductive electrode material surfaces or 'skins' of these structures that would effect the movement of portions of energy propagations that could also be found within such defined areas in an energized state in one example, or such as 810F-1&2 and 820F-1&2 such as 800F-1&2, comprising common shields 810B-1&2 and 820B1&2—and containing differential bypass electrode pathway 865BT like in FIG. 3, including areas abutting or bordering along conductive electrode material surfaces or 'skins' of these structures that would effect the movement of portions of energy propagations that could also be found within such defined areas in an energized state for another example(not shown).

Separation distance 814A is a generally very little parallel adjacent area of three dimensional separation distance or proximity of spacing found between multiple adjacent common electrode material pathways such as common electrode pathway 820B—and common electrode pathway image shield 850B/850B-IM—for example containing a thin dielectric material 801 or spacing equivalent (not fully shown) or other type of spacer (not shown).

Separation distance 814C is the vertical separation found between common electrode pathways such as common electrode pathway 820B—and differential electrode pathways such as differential electrode pathways 865BT. Separation distance 814B is the vertical separation between SPLIT differential conductive pathways such as SPLIT differential conductive pathways 797SF1-A and 797SF1-B.

These unique combinations of dynamic and static forces (not shown) occur simultaneously within the containment of shielding electrode structure and due to its use as a conduit, to a third energy pathway distinct from the differential pathways. Thus by utilizing and combining various rules of physical element distance and energy field separations between conductive energy pathways, dielectric materials, nonconductive materials, as well as the dynamic energy relationships that are taking place within an energized circuit pathway, a new utility and circuit energy-conditioning ability is provided.

Internally, unbalanced circuits within prior art energy conditioners that are not operating with opposing differential environments will almost always normally produce wide degrees of hysteresis effect, material memory effect, angular stresses, expansion due to thermal stressing various materials, each having a different temperature coefficient of expansion and like, and are all reduced in terms of their effective voltage dividing ability from that taking place within a mutually opposing energy propagation that is taking place within an invention embodiment from all angles, in contrast.

Thus, hysteresis effect is significantly reduced closer to zero within an invention embodiment due to the complementary stress forces placed upon the materials arriving in a manner that is almost 180 degrees manner simultaneously on the other side of the interposed common electrode energy pathways, energy. These stress handling techniques as disclosed are very difficult to duplicate with prior art componentry, if at all. This is particularly true for prior art componentry configured in feedthru propagation modes and applications. 79S"X" used for designation of the conductive electrode extension portions allows flow of portions of propagating energy along the internally positioned differential conductive electrodes that are arriving from external conductive connection structures (not fully shown) that are attached by standard industry means and methodologies.

A new invention embodiment like 9210 shown in FIG. 7A and FIG. 7B can be comprised of a SPLIT electrode 7300C and 7300D straight feedthru version which are positioned or spaced closely relative to one another in such a manner that each set of SPLIT-differential electrode planes of conductive electrode materials 799 normally appear to be comprise a completed 9210 with the same or slightly less in volumetric size then that of a prior art structure, yet with more efficient and larger energy handling capacity than that found in an identically sized prior art device containing more distinct numbers of same sized SPLIT differential feed thru conductive differential electrodes.

The difference would be that the new invention would allow for more energy carrying or energy propagation ability utilizing less layerings, occupying less area, allowing for more circuitry conductive connections while simultaneously handling energy-conditioning demands of a plurality of energy pathways this small, but significant configuration within the new invention configurations like 9210 of FIG. 7A or the like.

Because of electrode positioning architecture, the prior art devices utilizing these closely positioned pairs of SPLIT-electrodes 7300C and 7300D for energy conditioning, will not be as effective or energy efficient as a new invention device that utilizes approximately ⅓ fewer SPLIT-layerings of the total electrodes in a similarly layered prior art stack-up. Yet, while a prior art device would effectively have doubled the number of current carrying electrodes for increasing its energy handling ability, the new invention with approx. 25–30% less of the same number of SPLIT-electrode pathways will be able to handle more energy than that of the prior art due to the predetermined arraignment of both SPLIT and non-SPLIT common and differential, conductive electrode energy-carrying pathways.

Thus 7300C and 7300D that together are defined as at least two single same-sized, energy pathways separated by at least a larger third common conductive shielding electrode energy pathway that is placed in an interposed positioned to be shared by both 7300C and 7300D for energy conditioning and voltage reference for circuit reference functions in embodiment 9210.

Split, differential electrodes 7300C and 7300D that comprise one set of electrically opposed and paired, similarly sized conductive material areas for part of many variations of energy conditioning embodiments utilizing a common voltage reference for the circuit reference functions. These two similarly sized conductive material or electrode energy pathway areas 7300C and 7300D are still smaller than the common shielding electrodes 810F-1 & 2, 800/800IM-1 & 2, 810B-1 & 2 that all together comprise a grouping of four distinct, yet closely spaced pairs of two units each of thin conductive electrode elements 797SF1-A, 797SF1-B and 797SF2A, 797SF2-B, respectively separated in substantially parallel relation in and among themselves by a thin layer of the dielectric casing material 801. (Refer to drawing 7A and replace designation 797SF1-A, 797SF1-B and 797SF2-A, 797SF2-B with 797F1-A, 797F1-B and 797F2-A, 797F2-B respectively)

Looking at FIG. 7A, it should be noted that similarly, each common, shielding electrode energy pathways also comprise a corresponding closely spaced pair of thin common, shielding electrode energy pathway elements because it is also beneficial in some configurations these common shielding electrode structure elements for these shielding electrodes to possess double the total electrode surface area because of using this configuration, the common shielding electrode structure elements that comprise the larger universal common conductive shielding electrode structure architecture with stacked hierarchy progression will also handle energy the main input or output energy propagation pathway functions in some attachment configurations. The common shielding electrode structure elements are utilized within an invention embodiment 9210 and the like, in most cases, as a third, additional energy transmission pathway not of the external differential energy pathways (not shown).

Figure 8:
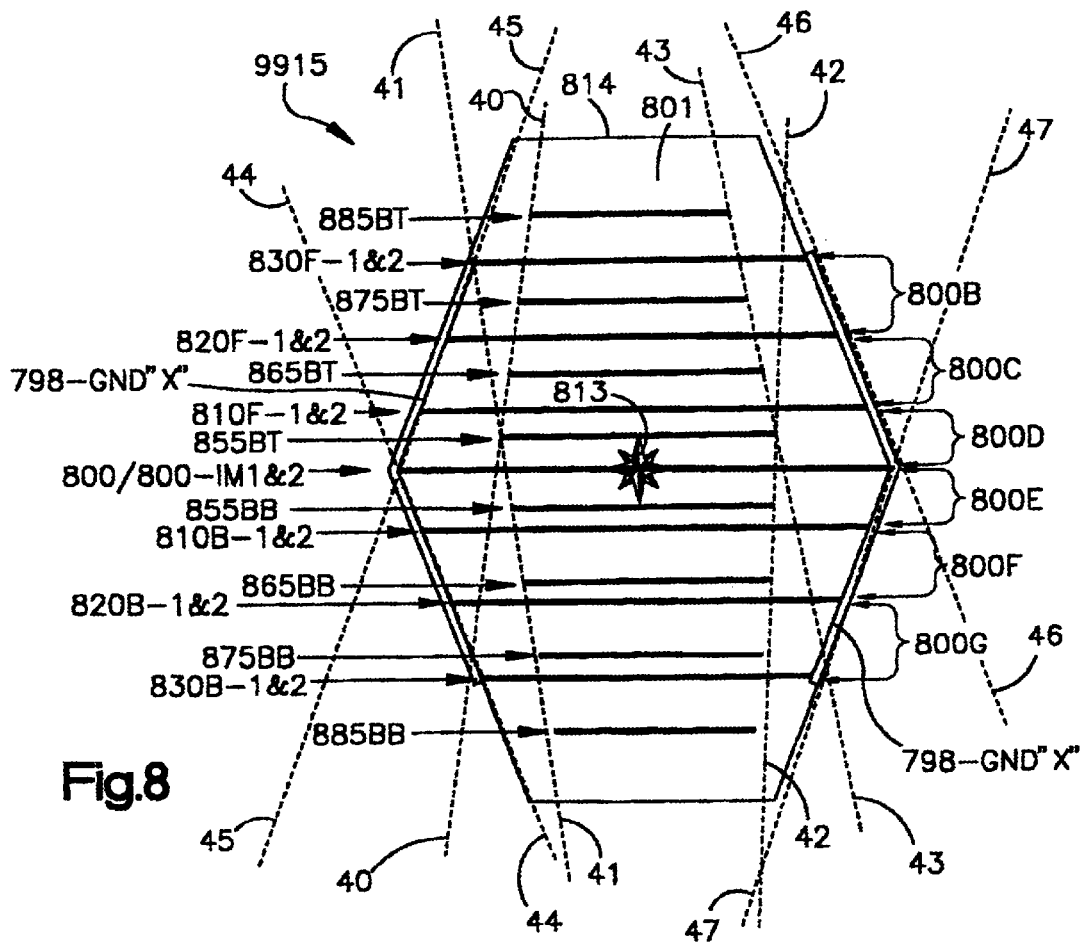
FIG. 8 shows portion of an alternate embodiment 9915 in a cross-sectional view that comprises pairs of electrically opposing differential electrode energy pathways configured in accordance with the present invention.

Jumping to FIG. 8, embodiment 9915, a new concept of relative element symmetry balancing electrode pairing that is used with a variation of the balanced and paired and same-sized electrically opposing, differential conductive pathways concept, yet in a relative element balancing pairing state is presented.

The relative symmetry element balancing pairing goes for the larger sandwiching common conductive pathways as well as the differential conductive pathways and relate to continued improvements to a new family of discrete, multi-functional energy conditioners that are different from the complementary same size-axiom presented earlier and will now relate to another variation concept of the new family of discrete, multi-functional energy conditioners.

Basically, the invention constitutes forming of various internal electrode patterns 799 and 799G, so that the principal electrode areas (excluding the electrode elongations 79-GNDA or 812A for example) are in a relative positioning to one another for a plurality of the inner electrodes as groups and individuals as well as pairs that are positioned decrease gradually (or stepwise) from the central part to the surface of the dielectrics 1 along the laminated directions of ceramic sheets. Alternatively, the internal electrode patterns (excluding the electrode elongations 79-GNDA or 812A for example) are formed, so that the areas taken up by the conductive principal surface areas (not shown from above) of a plurality of the internal electrodes are decreasing gradually (or stepwise) in both directions out, symmetrically between positions apart from the central common shielding electrode which is serving as the balancing point of the symmetry. The pairings in this case are between the dividing 800-1&2/800-IM-1 & 2 central common shielding electrode. Part to the surfaces of the dielectric 801 along the laminated directions of dielectric material 801 sheets (not shown).

In larger stacked ups (5 common and differential energy pathway stack-up combinations) of an invention embodiment, like 9915 of FIG. 8 for example, by looking at a cross-section of an invention embodiment and observing the paired, electrically opposing, differential conductive pathways 855BB, 855BT, 865BB, 865BT, 875BB, 875BT, 885BB and 885BT (all of which could be split-electrodes) that are in place and working out respectively, from the center common share electrode pathway 800/800-IM, one could observe a difference (other material elements of —9915 are omitted in this portion of the disclosure for concept clarity reasons ) with a first pairing of same sized electrically opposing, differential conductive pathways 855BB and 855BT and at the placement of the first and second common conductive shielding energy pathways 810F-1 & 2 and 810B-1 & 2.

It can be seen that one could place a third and fourth size-reduced or third and fourth size-enlarged next set of electrically opposing, differential conductive pathways, such as 865BB and 865BT, that would then be positioned to sandwich total previous placement of the center common share electrode pathway 800/800-IM, the first pairing of same sized electrically opposing, differential conductive pathways 855BB and 855BT, and the first and second common conductive shielding energy pathways 810F-1&2 and 810B-1&2.

Thus, the device or embodiment is proportionally and symmetrically balanced with proportionally reduced or enlarged same-sized third and fourth differential conductive pathways 865BB and 865BT, one sees that they are still at least even but preferably setback 40, 41, 42, 43, within the subsequent sandwiching fourth and fifth common conductive shielding energy pathways 820B-1&2 and 820F-1&2, and so on, one is offered an additional invention variation 9915 that still follows the general principals of a universal multi-functional common conductive shield structure plus two electrically opposing differential energy pathways (885BT and 885BB in 9915), which in part uses a faraday shield architecture with stacked conductive hierarchy progression.

This concept could also be used for a universal multi-functional common conductive shield structure (not shown) comprising circuitry for energies (not shown) propagating simultaneous along paired and electrically differential pathways 855BB, 855BT, 865BB, 865BT, 875BB, 875BT, 885BB and 885BT that utilize bypass or feed-thru (not shown) energy propagation modes.

Thus, a predetermined pattern of matching and same-sized symmetrically, paired of differential conductive pathways 855BB, 855BT, 865BB, 865BT, 875BB, 875BT, 885BB and 885BT that are physically parallel to one another as well as located relative to one another respectively, on opposite sides of the central common conductive shielding energy pathway 800/800-IM-1&2, and can be placed or positioned with a setback scheme 40, 41, 42, 43, for example so that 855BB, 855BT, 865BB, 865BT, 875BB, 875BT, 885BB and 885BT are not necessarily matched to the respective neighboring differential electrode that was placed before it, like 885BT and 875BT for example. The relative pair axiom concept disclosed is that these matching and physically parallel, same-sized pair of differential conductive pathways 855BB, 855BT, 865BB, 865BT, 875BB, 875BT, 885BB and 885BT are primarily matched in size, relative and respectively to one another (855BB to 855BT, 865BB to 865BT, 875BB to 875BT, and 885BB to 885BT, but not necessarily matched as adjacent neighbors in size (855BB to 865BB to 875BB to 885BB, for example) as in other embodiments like 9905 of FIG. 3 for example, instead, and are not necessarily relative and respective to a previously deposited differential conductive pathway neighbor (separated by at least one common conductive shielding energy pathway 830F-1&2, 820F-1&2, 810F-1&2, 800/800-IM-1&2, 810B-1&2, 820B-1&2 and 830B-1&2).

Thus, a relative pairing concept and a setback scheme could also extend even further to include the common pathway electrodes -830F-1&2, 820F-1&2, 810F-1&2, 800/800-IM-1&2, 810B-1&2, 820B-1&2 and 830B-1&2 of the shield electrode structure elements as with setback scheme 44, 45, 46 and 47, so as long as each invention embodiment variation could comprise certain portions of the various other materials and methodology placement concept elements like a 801 material, the 814-"X" relative setback areas (814A, 814B, 814C, 814D, etc. when needed) or a connection element like798- GND'X' for discrete versions, (while not always used for non-discrete versions, for example), that are deposited on either side of the key, and axiomatic center common share electrode pathway 800/800-IM when they are manufactured, (800/800-IM is always a functioning starting point relative to any subsequent layerings or deposits, but not necessarily a manufacturing starting point).

As long as the various relative pairings are matched and symmetrically paired for complementary opposed alignment and maintain the other distance relationships and setbacks in a relative paired or relative balancing symmetrical relationship, an invention embodiment variation will operate in a predetermined electrical conditioning manner with respect to various energy conditioning functions required by the user. This relative balancing, relative "twin pairing " or relative "mirror-like" element match-off or relative pair balancing is a novel improvement over the of the previous embodiments such as 9905 and a structural improvement that will produce many unexpected results and will be viable as long as electrostatic shielding function (not shown) of universal faraday shield architecture with stacked conductive hierarchy progression comprising the paired, electrically opposing differential conductive pathways is not compromised. This concept of relative pairing is also included for invention embodiments that do not use the outer, paired, electrically opposing differential conductive pathways as described in other co-owned and co-pending disclosures. It should be noted that 9915 could be inverse in tapering of setback schemes 40, 41, 42, 43, 44, 45, 46, 47 or any variation of set backing that is possible and are fully contemplated by the applicants.

The combination of external trace ways, conductive pathways and conductors, etc. with one of the numerous embodiments fully described or not in this document, of the pre-determined split-electrode layered arrangement in the preceding text, can make up one full invention configuration, when energized. Without limitation of the present invention an example of an assembly in accordance with the invention is provided below in FIG. 9.

Figure 9:
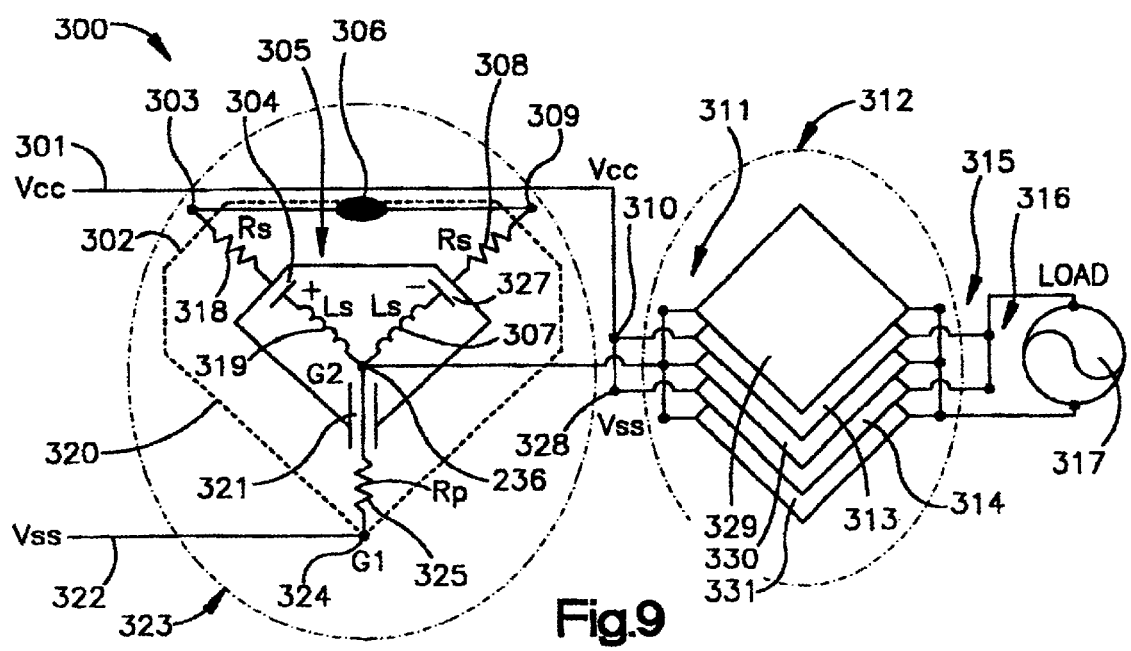
FIG. 9 shows circuit combination of split electrodes utilized by all of the electrodes present in an embodiment. Alternates of this can have one of two of the groups of electrodes configured un-split as an option in accordance with the present invention.

In FIG. 9, the circuit and electrodes simply schematically illustrate a two pathway circuit formed by predetermined conductive material attachment (not shown) located external to the predetermined arrangements various split-electrodes that make up part of the invention embodiment, shown. These conductive circuit attachments can be made regardless of the embodiment encasement in the sense of a discrete or non-discrete embodiment of pre-determined conductors not of the actual layers themselves to the external structure pathways utilizing the connecting split-electrode portion of the invention. The following is a listing of the various portions involved with the circuit:

300 split-electrode pathway, electrically common-sourced differential electrode layers, and common connected and common load-sourced split-electrode shield layerings combined into the overall circuitry created by the energization and attachment configuration that shows a source, a—pathway 301, a load 317 and return pathway 322.

301 Schematic representation of the 'power in' conductive energy path or Vcc

302 Schematic representation of highlighted area of dynamic function

303 Schematic representation of attachment point and/or structure of one (I) non-common, differential conductive split-electrode to an external conductor that has approximately ½ of the portions of energy fed from a single, external power path (split of the portions of energy going in to both "A" & "B" differential split-electrodes) such that the portions of energy enters in opposed directions from both 303 & 309 into the layered electrode arrangement.

304 Schematic representation of an energy conditioner formed between a differential split-electrode and the common return split-electrode/pathway

305 Schematic representation denoting a "0" voltage circuit reference for both the differential split-electrodes relative to the shielding split-electrodes or return split-electrodes 329, 330, 331 and the shielding effects created.

306 Schematics representation of the splitting point of energy path into the split-electrode elements 313, 314

307 Schematic representation of the inductance inherent the common differential conductive split-electrode

308 Schematic representation of the resistance inherent to the common differential conductive split-electrode

309 Schematic representation of the attachment point and/or structure of one (1) the common differential conductive split-electrodes to an external conductor that has approximately ½ of the portions of energy fed from a single, external power path (split of the portions of energy going in to both "A" & "B" the common differential conductive split-electrode) such that the portions of energy enters in opposed directions from both 303 & 309 into the layered electrode arrangement

310 Represents the same attachment point and/or structure of one (1) the common differential conductive split-electrode 309 highlighted area of dynamic function

311 Layered differential split-electrode and common split-electrode shield elements as a group

312 The layered invention with split-electrode configurations pulled off to the side to better explain the layerings from the circuitry portions.

313 Differential split-electrode "A"

314 Differential split-electrode "B"

315 Representation of connections of circuitry and re-combining point of the split portions of energy transmission

316 Representation of the re-combining point of the split portions of energy transmission (optional)

317 Load receiving the portions of energy for usage

318 Representation of the resistance inherent to the conductive split-electrodes

319 Representation of the inductance inherent to the conductive split-electrodes that cancels

320 Highlighted area of dynamic function within the 305 areas.

321 Representation of a line-to-line capacitive element that is formed during energization.

322 Conductive energy return path VSS

323 Representing the—area of dynamic function within the invention area 312

324 Exit point of the return portions of energy from the feeding-thru common conductive split-electrodes and load returning to source

325 Resistance inherent to the common conductive split-electrodes

326 Entry point of the feeding-thru return portions of energy from the load into the common conductive split-electrodes -returning back to source

327 Line to common split-electrodes —energy conditioner that are formed during energization.

328 Represents the same attachment point and/or structure of (1) conductive split-electrode 303

329 Common conductive split-electrode

330 Common conductive split-electrode

331 Common conductive split-electrode

The circuit and functions shown FIG. 9 in a two-line circuit without the option of a third pathway connection. The invention circuit and device functions shown FIG. 9 operate like a shielding switching regulator with capacitive and inductive cancellation functions in a predetermined aligned stacking of smaller and larger groups of two separate functioning groups of split electrodes 329,330,331 and 313 and 314. These two groups of split-electrodes, common yet and in this case now differential only by orientation sense of the word. Thus, yielding one large ideal energy conditioning circuit between Vdd and Vss with return through the invention's circuit common split-electrodes shields pulling double duty as the primary circuit portion element used both as a portions of energy return, and voltage image with shielding central common electrode 330.

To optimize the decoupling performance, invention circuit and device should be located as close to the load 317 as possible, this will minimize the stray inductance and resistance associated (not shown) with the internal electrode portion 314, 313 of circuit traces 301, 322, thereby taking full advantage of the invention circuit and device properties and capabilities for utilization by the portions taking the energy paths in it their propagations to undergo conditioning. In this example portions of energies in the circuit will operate in a bypass propagation mode with respect to over all handling by respective physically differential bypass split-electrodes 313 and 314 and will operate in a feed-thru relationship thorough the device as it returns back to the source (not shown) through the central common split-electrode 330 and sandwiching common split-electrodes 329, 331, which now also used as a portions of energy return 322, exclusively. Shielding split-electrodes a attachment configuration also has the possibility to bypass the propagating energies on an energy path (not shown) that could be connected by way of 325 and 326 termination structure or connection points 325 and 326 between the source (not shown) and the load 317, establishing an alternative third path way and one of lower impedance and resistance and allowing the unwanted portions of energy to flow from common split-electrodes, now also used as a portions of energy return 322, exclusively, rather than to the back to source (not shown).

It should also be noted that the current path of the portions of energy under conditioning will operate in a bypass mode with respect to over all handling by respective physically differential bypass split-electrodes 313 and 314 but will operate in a feed-thru relationship thorough filter 300 as it returns back to the source through the central common split-electrodes now also used as a energy return, exclusively and shielding split-electrodes in one attachment configuration possibility.

Layerings found in 312 are not limited in numbers however; the common electrode shielding electrodes is desired to be an odd integer number in units used. This allows for a balance of the shielding electrodes 329 and 331 in this case, to be evenly distributed on each respective side of the central shielding electrode 330 are related in that the same-layered element can be used for both circuits although each circuit is quite different.

The difference in the circuit lays with the pre-determined attachment to external differential split-electrodes or paths and pre-determined attachment to common conductive structures, areas or paths when elements of the invention are combined in such a manner by industry standard insertion or attachment methods into a larger electrical system and energized.

Functions obtained, include, but are not limited to, simultaneous, differential mode and common mode filtering, surge protection and decoupling, mutual flux cancellation of certain types of electromagnetic energy field propagations, containment and suppression of e & h electromagnetic energy field propagations, various parasitic emissions, with minimal portions of energy degradation not normally found by using prior embodiments that do not contain such elements as described in proceeding text.

It should be noted that both discrete and non-discreet invention embodiment variations that use the common conductive shield structure with a common external conductive element as disclosed as well as using various dielectrics that have been categorized primarily for a certain electrical conditioning functions or results, will almost always find that new usage as invention elements constructed will almost always achieve unexpected and beneficial characteristics added to the previously limited usage knowledge of the specific dielectric material used. This includes almost any possible layered application that uses non-discreet capacitive or inductive structures that can incorporate a variation of an invention embodiment within a manufactured discrete silicon die and the like, for example, or a super capacitor application or even an atomic level energy conditioning structure.

Thus, almost all embodiments and variations of an invention embodiment similarly constructed or manufactured by standard means and used with standard, multiple, paired line circuit situations and having a dielectric difference as the only significant variation between identically configured invention embodiments will almost always yield an insertion loss performance measurement in a manner that is unexpected and unobvious considering the respectively known dielectric material response of prior art. This comparison of like similar type invention units (other than of dielectric material) clearly and unequivocally reveals the primarily reason or factor causing this result and circuit performances is balance of elements within the embodiments, the larger common conductive shield structure and the conductive attachment of a common external conductive element that is working in combination using electrostatic suppression, physical shielding for influencing the conditioning of energy propagated within a circuit system that the various invention embodiments are incorporated into.

The invention attachment to a same common conductive external area or pathway of all common and conductively attached common electrode elements will almost always allow AOC (area of convergence) propagated energy to operate electrically parallel with respect to the source(s) and the load(s) as well as operate electrically in parallel with the other common conductive structures positioned not only to each other but also with respect to almost any main circuit when connected to a separate return path, inherent ground, chassis ground or low impedance pathway not of the differential conductive pathways. With the USS (universal shield structure) placed and attached as described in an energized circuit, common conductive energy pathways in parallel to the internal and external differential energy pathways, as disclosed will almost always enhance and lower the impedance of the third conductive/common conductive pathway within the AOC to allow propagated energy a possible return path that can be utilized by portions of energy originating from a Source.

It should be noted that although normally both the external and internal differential electrode energy pathways are complementary, once an invention is placed upon the common conductive area such as one possibly created by the puddle solder material placed during a test creates a slight, but unimportant un-balance among the common conductive plates that is noted as non-critical. The addition of the outer positioned common conductive paths adds back the conductive energy pathway balance and shifts the self-resonant point out higher in frequency then in similar-type-invention testing. It is disclosed as shown in FIG.2 and FIG. 3 that additionally placed, common conductive energy pathways those marked (#-IM) attached with the inherent central, shared image "0" voltage reference plane will almost always increase the shielding effectiveness of an invention embodiment. These are additionally placed common conductive energy pathways located outside and sandwiching in close proximity to its adjacent internally positioned neighbor is for a purpose larger than that of adding capacitance to the USS embodiments. These additionally placed common conductive energy pathways are placed before any final application of at least one set of outer differential electrode pair(s)

The sandwiching function of these outer paired differential conductive pathways between the essential groupings of paired conductive shield-like containers 800X will almost always aid in effecting the energy propagation relative to externally attached common conductive areas and/or third energy pathway which is a common conductive area.

The sandwiching and insetting function of these outer paired differential conductive pathways between the essential groupings of paired conductive shield-like containers 800'X' will almost always again aid to in effecting the energy propagation relative to externally attached common conductive areas and/or third energy pathway which is a common conductive area. It should be noted that if the shielding 800 "X" container structures that make up an invention should be in balance, according to the stacking sequence described.

Within almost any variation of an invention embodiment, at least three, distinctly different simultaneous energy conditioning functions will almost always occur as long as the circuit shielding of the active energy pathways within the area footprint of the sandwiching common conductive shielding energy pathways are maintained and contained within the AOC. These functions can be broken down into at least three species of circuit shielding occurring simultaneously within an invention embodiment:

A physical Faraday cage-like effect or electrostatic shielding effect function with electrically charged containment of internally generated energy parasitics shielded from the active differential conductive energy pathways as well as providing a physical protection from externally generated energy parasitics coupling to the same active differential conductive energy pathways as well as a minimization of energy parasitics is attributed to the almost total energized and physical shield envelopment utilizing the insetting of the active energy pathways within the area foot print of the sandwiching common conductive shielding energy pathways;

The interposition of physical conductive material and dielectric shielding function that allows for a very small distance of separation of oppositely charged active differential conductive energy pathways contained within common energy pathways of influence one another in an electrically and magnetically controlled manner.

Mutual energy flux field cancellation of various portions of energy propagating in a manner along paired and electrically opposing complementary electrode or conductive energy pathways along with simultaneous stray energy parasitic complementary charged suppression and physical shielding and electrical shielding containment effects are key reasons of the functionality of an invention embodiment.

Because magnetic lines of flux travel counterclockwise within a transmission line or line conductor or layer, if the RF return path is parallel and adjacent to its corresponding Source trace, the magnetic flux lines observed in the return path (counterclockwise field), related to the Source path (clockwise field), will almost always be in the opposing directions. When one combines a clockwise field with a counterclockwise field, a cancellation or minimization effect is observed. The closer the pathways are brought together, the better the cancellation effect.

Use of a "0" voltage reference created by the centrally positioned and shared common shielding energy pathway electrode is a complementary charged part of two distinct common conductive shield structures. The parallel movement shielding effect (as opposed to a series movement effect by a majority of the portions of energy using the AOC) in which each energy portion operating on one side of the central common and shared conductive energy pathway in a electrical complementary charged and/or magnetic operation will almost always have a parallel, non-reinforcing but complementary charged counterpart that operates in a generally opposing cancellation-type or complementary manner, simultaneously.

The invention will also be utilizing sandwiching electrostatic shielding functions for simultaneous complementary charged suppressions within a predefined electrodes area defined by the common electrode edges relative to the edges of the differential electrode edges to interact between or within the common conductive shield structure as has been described in this disclosure.

All or all most all conductively layered electrodes or energy pathways internally, are simultaneously being utilized by portions of propagated energy located on opposite sides of the critical centrally positioned common conductive energy pathway electrode and "0" voltage reference planes (which includes the #-IM's extra common electrode shields that are non-spilt in definition).

An electrically parallel fashion means with respect to the conductive energy pathways utilized by portions of energy propagated from an operating source(s) propagated to the AOC and then propagating further to the energy-utilizing source(s) and then, portions of energy are propagated from the energy-utilizing load(s) to the AOC and than portions returning by way of the AOC to Source pathways or portions are taken off through the low impedance pathway enhanced by the third conductive set of pathways that are common within the AOC and to one another that leads to the externally positioned common conductive external pathways. As described a properly attached invention whether discrete or non-discrete will almost always aid in achieving a simultaneous ability to perform multiple and distinct energy conditioning functions such as decoupling, filtering, voltage balancing using parallel electrical positioning principals for plurality of separate and distinct circuits, which are almost always relative to the energy Source, paired conductive energy pathways, the energy utilizing load and the conductive energy pathways returning back to the Source to complete the circuit.

This also includes the opposing but electrically canceling and complimentary positioning of portions of propagated energy acting upon the conductive energy pathways in a balanced manner on opposite sides of a "0" Voltage reference created simultaneously using the pivotal centrally positioned common and shared conductive electrode pathway. This generally almost always-parallel energy distribution scheme allows the material make up of all of the manufactured invention elements to operate together more effectively and efficiently with the load and the Source pathways located within a circuit. By operating in a complementary manner material stress in significantly reduced as compared to the prior art. Thus, phenomena such as elastic material memory or hysteresis effect in minimized.

Piezoelectric effect is also substantially minimized for the materials that make up portions of an invention embodiment, thus energy is not detoured our inefficiently utilized internally within the AOC and is automatically available for use by the load in a largely dramatic increase in the ability of standard and common dielectric materials to perform functions within the AOC and the circuitry in a broader, less restrictive use, thus reducing costs while allowing performance levels above that of prior art. In an energized state minimization of both hysteresis along with control of the piezoelectric effects upon dielectric and conductive material stresses within the AOC of an invention embodiment translates or equals an increase performance levels for such applications as SSO states, decoupling power systems. Quicker utilization of the passive component by the active componentry is also achieved directly attributed to these stress reductions and the complementary manner in which propagated energy is allowed to utilize the invention.

Next, additional common conductive energy pathways surrounding the combination of a shared centrally positioned conductive energy pathway or surrounding a grouped placement of center conductive energy pathways and a plurality of differential conductive electrodes can be employed to provide an increased inherent ground and optimized Faraday cage-like function and surge dissipation area as well as increase or enhance the low impedance effect of the common conductive pathway and connection structures not considered part of the differential conductive pathways as described in all embodiments.

In addition, an invention embodiment, although not shown, could easily be fabricated in silicon and directly incorporated into integrated circuit microprocessor circuitry or chips. Integrated circuits are already being made having capacitors etched within the silicon die or semiconductor die or silicon foundation which allows the architecture of the present invention to readily be incorporated with technology available today.

In closing, it is noted that prior art energy conditioning devices normally connect between paired and external, electrically opposing differential energy pathways in a line to line placement scheme so to have an improve energy conditioning function from that of other needed prior art energy conditioning devices used elsewhere within the circuit in order to handle a high input impedance (Z) state that develops for the line to line portions of a circuit utilized by propagating circuit energies. Thus, a line to line placement scheme while indeed possessing an improve energy conditioning function, will almost always need at least two additional, prior art energy conditioning devices to be placed line to ground respectively, between each of the same external electrically opposing differential energy pathways and to a ground connection. This additional placement is required to condition the portions of propagating energies that are still requiring energy conditioning to just maintain the nominal operation of the circuit just described. This need is partly due to the inherently created internal inductive circuit elements that develop within each various prior art energy conditioning devices as they are operated within the energized circuit, and are almost always present with their usage.

Minimally, these three elements are providing simultaneous cancellation and suppression energy conditioning functions (hence, very effective filtering) for portions of propagating circuit energies within, such that the propagating circuit energies within the AOC circuit portion of a layered invention arrangement do not develop, nor do they require, any inductive circuit elements ("L") within this portion of an energized circuit. Thus, almost all variations of the new energy conditioning invention embodiments will almost always provide an exponentially broader bandwidth filtering function from that of the prior art capacitors or prior art energy conditioning devices of the same size and capacitive value.

Finally, from a review of the numerous embodiments it should be apparent that the shape, thickness or size may be varied depending on the electrical application derived from the arrangement of common conductive shielding electrode pathways and attachment structures to form at least (2) conductive containers that subsequently create at least one larger singly conductive and homogenous faraday cage-like shield structure or invention portion which in turn can contain portions of paired differential conductive electrodes or paired energy pathways in a discrete or non-discrete operating manner within at least one or more energized circuit.

Although the principals, preferred embodiments and preferred operation of the present invention have been described in detail herein, this is not to be construed as being limited to the particular illustrative forms disclosed. Thus, it will become apparent to those skilled in the art that various modifications of the preferred embodiments herein can be made without departing from the spirit or scope of an invention embodiment as defined.

What is claimed is:

1. An energy conditioner comprising:
    a plurality of common electrodes that are conductively coupled to each other, and wherein said plurality of common electrodes comprise at least a first common electrode, a second common electrode, and a third common electrode, that are each, generally, of the same size and of the same shape;
    at least one pair of split electrodes positioned complementary to each other, and wherein said at least one pair of split electrodes comprise a first split electrode and a second split electrode that are each, generally, of the same size and of the same shape;
    said first split electrode and second split electrode of said at least one pair of split electrodes are each, equally smaller than said any one common electrode of said plurality of common electrodes, and wherein said at least one pair of split electrodes are positioned almost completely inset of said plurality of common electrodes, and wherein said first split electrode is stacked above said first common electrode and said second split electrode is stacked below said first common electrode, wherein said second common electrode is stacked above said first split electrode and said third common electrode is stacked below said second split electrode;
    material having predetermined properties, wherein said material is operable between said plurality of common electrodes and said at least one pair of split electrodes for preventing direct electrical coupling from at least said plurality of common electrodes to at least said at least one pair of split electrodes; and
    said plurality of common electrodes, said material having predetermined properties, and said at least one pair of split electrodes form at least a plurality of energy conditioning elements.

2. The energy conditioner of claim 1, wherein said material having predetermined properties comprises a dielectric material.

3. The energy conditioner of claim 1, wherein said energy conditioner is practicable for a measured line-to-line capacitance value of approximately half of the line-to-ground capacitance value measured.

4. The energy conditioner of claim 1, wherein said energy conditioner is practicable for canceling complementary mutual energy coupling.

5. The energy conditioner of claim 1, further comprising at least two outer sandwiching split electrodes.

6. The energy conditioner of claim 1, operable as a feedthru capacitor array.

7. The energy conditioner of claim 1, operable as a crossover feedthru capacitor array.

8. The energy conditioner of claim 1, operable as a bypass capacitor array.

9. The energy conditioner of claim 1, operable as a bypass capacitor.

10. The energy conditioner of claim 1, wherein said plurality of common electrodes are split common electrodes.

11. A multi-layered energy conditioner comprising:
    at least one pair of electrode structures that are positioned complementary, aligned, and stacked parallel to each other;
    each electrode structure of said at least one pair of electrode structures comprises at least one split differential electrode, at least two shielding common electrodes, and means for preventing direct electrical coupling from at least said at least two shielding common electrodes to at least said at least one split differential electrode;
    said at least one split differential electrode of each said electrode structure of said at least one pair of electrode structures is smaller than any one shielding common electrode of said at least two shielding common electrodes of each said electrode structure of said at least one pair of electrode structures;
    said at least one split differential electrode is both inset and sandwiched between said at least two shielding common electrodes;
    at least one shielding common electrode of said at least one pair of shielding common electrodes is operable as at least a central electrode of said multi-layered energy conditioner that is simultaneously comprised of both said at least one pair of common shielding electrode structures equally; and said multi-layered energy conditioner is practicable for at least complementary energy conditioning.

12. The multi-layered energy conditioner of claim 1, wherein said material having predetermined properties comprises dielectric properties.

13. The multi-layered energy conditioner of claim 1, wherein said multi-layered energy conditioner is practicable for a measured line-to-line capacitance value of approximately half of the line-to-ground capacitance value measured.

14. The multi-layered energy conditioner of claim 1, wherein said multi-layered energy conditioner is practicable for canceling complementary mutual energy coupling.

15. The multi-layered energy conditioner of claim 1, further comprising at least two outer sandwiching split differential electrodes.

16. The multi-layered energy conditioner of claim 1, operable as a feedthru capacitor array.

17. The multi-layered energy conditioner of claim 1, operable as a crossover feedthru capacitor array.

18. The multi-layered energy conditioner of claim 1, operable as a bypass capacitor array.

19. The multi-layered energy conditioner of claim 1, operable as a bypass capacitor.

20. A circuit assembly practicable for energized operation comprising; an energy source;

an energy-utilizing load;

an energy conditioning component comprising;

a plurality of common electrodes that are conductively coupled to each other, and wherein said plurality of common electrodes comprise at least a first common electrode, a second common electrode, and a third common electrode, that are each, generally, of the same size and of the same shape;

at least one pair of split electrodes positioned complementary to each other, and wherein said at least one pair of split electrodes comprise a first split electrode and a second split electrode that are each, generally, of the same size and of the same shape;

said first split electrode and second split electrode of said at least one pair of split electrodes are each, equally smaller than said any one common electrode of said plurality of common electrodes, and wherein said at least one pair of split electrodes are positioned almost completely inset of said plurality of common electrodes, and wherein said first split electrode is stacked above said first common electrode and said second split electrode is stacked below said first common electrode, wherein said second common electrode is stacked above said first split electrode and said third common electrode is stacked below said second split electrode;

material having predetermined properties, wherein said material is operable between said plurality of common electrodes and said at least one pair of split electrodes for preventing direct electrical coupling from at least said plurality of common electrodes to at least said at least one pair of split electrodes; and wherein said energy source, said energy-utilizing load and said energy conditioning component are selectively and electrically coupled to each other by predetermined manner to form at least a circuit practicable for energization.

21. The circuit assembly practicable for energized operation of claim 20, operable as a bypass circuit.

22. The circuit assembly practicable for energized operation of claim 20, operable as a feed-thru circuit.

23. The circuit assembly practicable for energized operation of claim 20, wherein said plurality of common electrodes are split common electrodes.

* * * * *

UNITED STATES PATENT AND TRADEMARK OFFICE
CERTIFICATE OF CORRECTION

PATENT NO. : 6,687,108 B1
DATED : February 3, 2004
INVENTOR(S) : William M. Anthony and Anthony A. Anthony It is certified that error appears in the above-identified patent and that said Letters Patent is hereby corrected as shown below:

Column 1,
Please replace lines 7-42, now reading "This application is a continuation-in-part of co-pending application Ser. No. 09/600,530 filed Jul. 18, 2000, which is a U.S. national stage application of international application PCT/US99/01040 filed Jan. 16, 1999; this application is also a continuation-in-part of co-pending application Ser. No. 09/632,048 filed Aug. 3, 2000, which is a continuation-in-part of co-pending application Ser. No. 09/594,447 filed Jun. 15, 2000, which is a continuation-in-part of application Ser. No. 09/579,606 filed May 26, 2000, which is a continuation-in-part of co-pending application Ser. No. 09/460,218 filed Dec. 13, 1999, which is a continuation of application Ser. No. 09/056,379 filed Apr. 7, 1998, now issued as U.S. Pat. No. 6,018,448, which is a continuation-in-part of application Ser. No. 09/008,769 filed Jan. 19, 1998, now issued as U.S. Pat. No. 6,097,581, which is a continuation-in-part of application Ser. No. 08/841,940 filed Apr. 8, 1997, now issued as U.S. Pat. No. 5,909,350."
with the following:
-- This application is a continuation-in-part of co-pending application Ser. No. 09/600,530 filed Jul. 18, 2000, which is a U.S. national stage entry of international application PCT/US99/01040 filed Jan. 16, 1999; this application is also a continuation-in-part of co-pending application Ser. No. 09/632,048 filed Aug. 3, 2000, which is a continuation-in-part of co-pending application Ser. No. 09/594,447 filed Jun. 15, 2000, which is a continuation-in-part of application Ser. No. 09/579,606 filed May 26, 2000, which is a continuation-in-part of co-pending application Ser. No. 09/460,218 filed Dec. 13, 1999, which is a continuation of application Ser, No. 09/056,379 filed Apr. 7, 1998, now issued as U.S. Pat. No. 6,018,448, which is a continuation-in-part of application Ser. No. 09/008,769 filed Jan. 19, 1998 now issued as U.S. Pat No. 6,097,581, which is a continuation-in-part of application Ser. No. 08/841,940 filed Apr. 8, 1997, now issued as U.S. Pat. No. 5,909,350; this application claims priority to U.S. Provisional Application No. 60/180,101 filed Feb. 3, 2000, U.S. Provisional Application No. 60/185,320 filed Feb. 28, 2000, U.S. Provisional Application No. 60/191,196 filed Mar. 22, 2000, U.S. Provisional Application No. 60/200,327 filed Apr. 28, 2000, U.S. Provisional Application No. 60/203,863 filed May 12, 2000, U.S. Provisional Application No. 60/215,314 filed Jun. 30, 2000, U.S. Provisional Application No. 60/225,497 filed Aug. 15, 2000,

UNITED STATES PATENT AND TRADEMARK OFFICE
CERTIFICATE OF CORRECTION

PATENT NO. : 6,687,108 B1
DATED : February 3, 2004
INVENTOR(S) : William M. Anthony and Anthony A. Anthony It is certified that error appears in the above-identified patent and that said Letters Patent is hereby corrected as shown below:

Column 1, (cont)
U.S. Provisional Application No. 60/241,128 filed Oct. 17, 2000, U.S. Provisional Application No. 60/248,914 filed Nov. 15, 2000, U.S. Provisional Application No. 60/252,766 filed Nov. 22, 2000, U.S. Provisional Application No. 60/253,793 filed Nov. 29, 2000, U.S. Provisional Application No. 60/255,818 filed Dec. 15, 2000. --

Signed and Sealed this

First Day of March, 2005

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,687,108 B1 |
| APPLICATION NO. | : 09/777021 |
| DATED | : February 3, 2004 |
| INVENTOR(S) | : Anthony et al. |

It is certified that error appears in the above-identified patent and that said Letters Patent is hereby corrected as shown below:

On the title page, item (63) reading "Continuation-in-part of co-pending application Ser. No. 09/600,530 filed Jul. 18, 2000, which is a U.S. national stage application of international application PCT/US99/01040 filed Jan. 16, 1999; this application is also a continuation-in-part of co-pending application Ser. No. 09/632,048 filed Aug. 3, 2000, which is a continuation-in-part of co-pending application Ser. No. 09/594,447 filed Jun. 15, 2000, which is a continuation-in-part of application Ser. No. 09/579,606 filed May 26, 2000, which is a continuation-in-part of co-pending application Ser. No. 09/460,218 filed Dec. 13, 1999, which is a continuation of application Ser. No. 09/056,379 filed Apr. 7, 1998, now issued as U.S. Pat. No. 6,018,448, which is a continuation-in-part of application Ser. No. 09/008,769 filed Jan. 19, 1998, now issued as U.S. Pat. No. 6,097,581, which is a continuation-in-part of application Ser. No. 08/841,940 filed Apr. 8, 1997, now issued as U.S. Pat. No. 5,909,350." should read -- Continuation-in-part of application Ser. No. 09/600,530 filed Jul. 18, 2000, now U.S. Pat. No. 6,498,710, which is a U.S. national stage application of international application PCT/US99/01040 filed Jan. 16, 1999, which is a continuation-in-part of application Ser. No. 09/056,379 filed Apr. 7, 1998, now issued as U.S. Pat. No. 6,018,448, which is a continuation-in-part of application Ser. No. 09/008,769 filed Jan. 19, 1998, now issued as U.S. Pat. No. 6,097,581, which is a continuation-in-part of application Ser. No. 08/841,940 filed Apr. 8, 1997, now issued as U.S. Pat. No. 5,909,350; this application is also a continuation-in-part of co-pending application Ser. No. 09/632,048 filed Aug. 3, 2000, now U.S. Pat. No. 6,738,249, which is a continuation-in-part of co-pending application Ser. No. 09/594,447 filed Jun. 15, 2000, now U.S. Pat. No. 6,636,406, which is a continuation-in-part of application Ser. No. 09/579,606 filed May 26, 2000, now U.S. Pat. No. 6,373,673, which is a continuation-in-part of co-pending application Ser. No. 09/460,218 filed Dec. 13, 1999, now U.S. Pat. No. 6,331,926, which is a continuation of application Ser. No. 09/056,379 filed Apr. 7, 1998, now issued as U.S. Pat. No. 6,018,448, which is a continuation-in-part of application Ser. No. 09/008,769 filed Jan. 19, 1998, now issued as U.S. Pat. No. 6,097,581, which is a continuation-in-part of application Ser. No. 08/841,940 filed Apr. 8, 1997, now issued as U.S. Pat. No. 5,909,350;

and application 09/632,048 is also a continuation-in-part of application Ser. No. 09/600,530 filed Jul. 18, 2000, now U.S. Pat. No. 6,498,710, which is a U.S. national stage application of international application PCT/US99/01040 filed Jan. 16, 1999, which is a continuation-in-part of application Ser. No. 09/056,379 filed Apr. 7, 1998, now issued as U.S. Pat. No. 6,018,448, which is a continuation-in-part of application Ser. No. 09/008,769 filed Jan. 19, 1998, now issued as U.S. Pat. No. 6,097,581, which is a continuation-in-part of application Ser. No. 08/841,940 filed Apr. 8, 1997, now issued as U.S. Pat. No. 5,909,350;

UNITED STATES PATENT AND TRADEMARK OFFICE
CERTIFICATE OF CORRECTION

PATENT NO. : 6,687,108 B1
APPLICATION NO. : 09/777021
DATED : February 3, 2004
INVENTOR(S) : Anthony et al.

It is certified that error appears in the above-identified patent and that said Letters Patent is hereby corrected as shown below:

and application 09/594,447 is also a continuation-in-part of application Ser. No. 09/600,530 filed Jul. 18, 2000, now U.S. Pat. No. 6,498,710, which is a U.S. national stage application of international application PCT/US99/01040 filed Jan. 16, 1999, which is a continuation-in-part of application Ser. No. 09/056,379 filed Apr. 7, 1998, now issued as U.S. Pat. No. 6,018,448, which is a continuation-in-part of application Ser. No. 09/008,769 filed Jan. 19, 1998, now issued as U.S. Pat. No. 6,097,581, which is a continuation-in-part of application Ser. No. 08/841,940 filed Apr. 8, 1997, now issued as U.S. Pat. No. 5,909,350;

and application 09/579,606 is also a continuation-in-part of application Ser. No. 09/600,530 filed Jul. 18, 2000, now U.S. Pat. No. 6,498,710, which is a U.S. national stage application of international application PCT/US99/01040 filed Jan. 16, 1999, which is a continuation-in-part of application Ser. No. 09/056,379 filed Apr. 7, 1998, now issued as U.S. Pat. No. 6,018,448, which is a continuation-in-part of application Ser. No. 09/008,769 filed Jan. 19, 1998, now issued as U.S. Pat. No. 6,097,581, which is a continuation-in-part of application Ser. No. 08/841,940 filed Apr. 8, 1997, now issued as U.S. Pat. No. 5,909,350. --

Column 1, lines 7 to 23, reading "This application is a continuation-in-part of co-pending application Ser. No. 09/600,530 filed Jul. 18, 2000, which is a U.S. national stage application of international application PCT/US99/01040 filed Jan. 16, 1999; this application is also a continuation-in-part of co-pending application Ser. No. 09/632,048 filed Aug. 3, 2000, which is a continuation-in-part of co-pending application Ser. No. 09/594,447 filed Jun. 15, 2000, which is a continuation-in-part of application Ser. No. 09/579,606 filed May 26, 2000, which is a continuation-in-part of co-pending application Ser. No. 09/460,218 filed Dec. 13, 1999, which is a continuation of application Ser. No. 09/056,379 filed Apr. 7, 1998, now issued as U.S. Pat. No. 6,018,448, which is a continuation-in-part of application Ser. No. 09/008,769 filed Jan. 19, 1998, now issued as U.S. Pat. No. 6,097,581, which is a continuation-in-part of application Ser. No. 08/841,940 filed Apr. 8, 1997, now issued as U.S. Pat. No. 5,909,350." should read

UNITED STATES PATENT AND TRADEMARK OFFICE
CERTIFICATE OF CORRECTION

PATENT NO. : 6,687,108 B1
APPLICATION NO. : 09/777021
DATED : February 3, 2004
INVENTOR(S) : Anthony et al.

It is certified that error appears in the above-identified patent and that said Letters Patent is hereby corrected as shown below:

-- This application is a continuation-in-part of co-pending application Ser. No. 09/600,530 filed Jul. 18, 2000, now U.S. Pat. No. 6,498,710, which is a U.S. national stage application of international application PCT/US99/01040 filed Jan. 16, 1999, which is a continuation-in-part of application Ser. No. 09/056,379 filed Apr. 7, 1998, now issued as U.S. Pat. No. 6,018,448, which is a continuation-in-part of application Ser. No. 09/008,769 filed Jan. 19, 1998, now issued as U.S. Pat. No. 6,097,581, which is a continuation-in-part of application Ser. No. 08/841,940 filed Apr. 8, 1997, now issued as U.S. Pat. No. 5,909,350; this application is also a continuation-in-part of co-pending application Ser. No. 09/632,048 filed Aug. 3, 2000, which is a continuation-in-part of co-pending application Ser. No. 09/594,447 filed Jun. 15, 2000, which is a continuation-in-part of application Ser. No. 09/579,606 filed May 26, 2000, which is a continuation-in-part of co-pending application Ser. No. 09/460,218 filed Dec. 13, 1999, which is a continuation of application Ser. No. 09/056,379 filed Apr. 7, 1998, now issued as U.S. Pat. No. 6,018,448, which is a continuation-in-part of application Ser. No. 09/008,769 filed Jan. 19, 1998, now issued as U.S. Pat. No. 6,097,581, which is a continuation-in-part of application Ser. No. 08/841,940 filed Apr. 8, 1997, now issued as U.S. Pat. No. 5,909,350;

and application 09/632,048 is also a continuation-in-part of application Ser. No. 09/600,530 filed Jul. 18, 2000, now U.S. Pat. No. 6,498,710, which is a U.S. national stage application of international application PCT/US99/01040 filed Jan. 16, 1999, which is a continuation-in-part of application Ser. No. 09/056,379 filed Apr. 7, 1998, now issued as U.S. Pat. No. 6,018,448, which is a continuation-in-part of application Ser. No. 09/008,769 filed Jan. 19, 1998, now issued as U.S. Pat. No. 6,097,581, which is a continuation-in-part of application Ser. No. 08/841,940 filed Apr. 8, 1997, now issued as U.S. Pat. No. 5,909,350;

and application 09/594,447 is also a continuation-in-part of application Ser. No. 09/600,530 filed Jul. 18, 2000, now U.S. Pat. No. 6,498,710, which is a U.S. national stage application of international application PCT/US99/01040 filed Jan. 16, 1999, which is a continuation-in-part of application Ser. No. 09/056,379 filed Apr. 7, 1998, now issued as U.S. Pat. No. 6,018,448, which is a continuation-in-part of application Ser. No. 09/008,769 filed Jan. 19, 1998, now issued as U.S. Pat. No. 6,097,581, which is a continuation-in-part of application Ser. No. 08/841,940 filed Apr. 8, 1997, now issued as U.S. Pat. No. 5,909,350;

UNITED STATES PATENT AND TRADEMARK OFFICE
CERTIFICATE OF CORRECTION

PATENT NO. : 6,687,108 B1
APPLICATION NO. : 09/777021
DATED : February 3, 2004
INVENTOR(S) : Anthony et al.

It is certified that error appears in the above-identified patent and that said Letters Patent is hereby corrected as shown below:

and application 09/579,606 is also a continuation-in-part of application Ser. No. 09/600,530 filed Jul. 18, 2000, now U.S. Pat. No. 6,498,710, which is a U.S. national stage application of international application PCT/US99/01040 filed Jan. 16, 1999, which is a continuation-in-part of application Ser. No. 09/056,379 filed Apr. 7, 1998, now issued as U.S. Pat. No. 6,018,448, which is a continuation-in-part of application Ser. No. 09/008,769 filed Jan. 19, 1998, now issued as U.S. Pat. No. 6,097,581, which is a continuation-in-part of application Ser. No. 08/841,940 filed Apr. 8, 1997, now issued as U.S. Pat. No. 5,909,350. --

This certificate supersedes the Certificate of Correction issued March 1, 2005.

Signed and Sealed this

Thirty-first Day of March, 2009

JOHN DOLL
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 6,687,108 B1 | |
| APPLICATION NO. | : 09/777021 | |
| DATED | : February 3, 2004 | |
| INVENTOR(S) | : William M. Anthony and Anthony A. Anthony | |

It is certified that error appears in the above-identified patent and that said Letters Patent is hereby corrected as shown below:

Column 6, line 44, "09/594,447" should be changed to --09/632,048--.

Signed and Sealed this
Tenth Day of May, 2011

David J. Kappos
*Director of the United States Patent and Trademark Office*